United States Patent
Huomo et al.

(10) Patent No.: US 10,218,181 B2
(45) Date of Patent: Feb. 26, 2019

(54) GRID FREQUENCY RESPONSE

(71) Applicant: Reactive Technologies Limited, Oxford (GB)

(72) Inventors: Heikki Huomo, Oulu (FI); Jukka Alakontiola, Oulu (FI)

(73) Assignee: Reactive Technologies Limited, Oxford (GB)

( * ) Notice: Subject to any disclaimer, the term of this patent is extended or adjusted under 35 U.S.C. 154(b) by 252 days.

(21) Appl. No.: 15/147,783

(22) Filed: May 5, 2016

(65) Prior Publication Data

US 2016/0248254 A1    Aug. 25, 2016

Related U.S. Application Data

(63) Continuation of application No. PCT/EP2014/073694, filed on Nov. 4, 2014.

(30) Foreign Application Priority Data

Nov. 6, 2013   (GB) .................................. 1319624.1

(51) Int. Cl.
    *H02J 3/00*    (2006.01)
    *H02J 3/38*    (2006.01)
    (Continued)

(52) U.S. Cl.
    CPC .......... *H02J 3/382* (2013.01); *G01R 19/2513* (2013.01); *H02J 3/24* (2013.01);
    (Continued)

(58) Field of Classification Search
    CPC ..................................................... H02J 3/382
    See application file for complete search history.

(56) References Cited

U.S. PATENT DOCUMENTS

| 2010/0072817 A1* | 3/2010 | Hirst | H02J 3/14 |
| | | | 307/31 |
| 2011/0181109 A1 | 7/2011 | Huomo | |

FOREIGN PATENT DOCUMENTS

| CN | 101238625 A | 8/2008 |
| CN | 103097726 A | 5/2013 |

(Continued)

OTHER PUBLICATIONS

UKIPO Search Report for Application No. GB1416620.1 dated Nov. 5, 2014.

(Continued)

*Primary Examiner* — Daniel Puentes
(74) *Attorney, Agent, or Firm* — EIP US LLP

(57) ABSTRACT

Methods, and apparatus for determining inertia within a synchronous area of an electric power grid are described. A frequency characteristic relating to a frequency of electricity flowing in the electric power grid is measured, a magnitude relating to a power flow modulation is determined based on data relating to power characteristics of one or more power units arranged to consume electric power from and/or provide real and/or reactive electric power to the electric power grid, and a frequency response characteristic associated with at least one area of the electric power grid is determined on the basis of the measured frequency characteristic and the determined magnitude characteristic. This enables frequency response characteristics within a synchronous area of the electric power grid to be easily determined.

41 Claims, 9 Drawing Sheets

(51) Int. Cl.
  *H02J 13/00* (2006.01)
  *G01R 19/25* (2006.01)
  *H02J 3/24* (2006.01)
  *H04B 3/54* (2006.01)
  *H02J 3/14* (2006.01)

(52) U.S. Cl.
  CPC .............. *H02J 3/383* (2013.01); *H02J 3/386* (2013.01); *H02J 13/0006* (2013.01); *H04B 3/546* (2013.01); *H02J 3/14* (2013.01); *H04B 2203/5416* (2013.01)

(56) References Cited

FOREIGN PATENT DOCUMENTS

| | | | |
|---|---|---|---|
| GB | 2426878 | A | 12/2006 |
| GB | 2493456 | A | 2/2013 |
| JP | 2001103669 | A | 4/2001 |
| JP | 2005020916 | A | 1/2005 |
| JP | 2011166890 | A | 8/2011 |
| JP | 5100764 | B2 | 12/2012 |
| JP | 2013009556 | A | 1/2013 |
| WO | 2012019613 | A1 | 2/2012 |
| WO | 2013010266 | A1 | 1/2013 |

OTHER PUBLICATIONS

International Search Report dated May 20, 2015 for PCT Application No. PCT/EP2014/073694.
UKIPO Search Report for Application No. GB1319624.1 dated Jan. 6, 2014.
Chinese Office Action dated Sep. 13, 2018 for Chinese Application No. 2014800607046.
Japanese Office Action dated Sep. 4, 2018 for Japanese Application No. 2016-527306.

* cited by examiner

GRID FREQUENCY RESPONSE

CROSS-REFERENCE TO RELATED APPLICATIONS

This application is a continuation of International Application No. PCT/EP2014/073694, filed Nov. 4, 2014, which claims the benefit of United Kingdom Application No. GB 1319624.1, filed Nov. 6, 2013. Each of the above-referenced patent applications is incorporated by reference in its entirety.

BACKGROUND OF THE INVENTION

Field of the Invention

The present invention relates to methods and apparatus for determining frequency response characteristics within an electric power grid.

Description of the Related Technology

The exchange of electrical power between providers and consumers takes place via an electricity distribution network or electric power grid. In such an electric power grid, electrical power is typically supplied by a combination of relatively large capacity power stations and relatively small capacity renewable energy sources.

Generators in large power stations, such as fossil fuel-burning or nuclear power stations, typically comprise rotating parts that have relatively high mass that are rotating at relatively high speeds, and accordingly are referred to as spinning generation. In the course of their normal operation, the spinning generators store relatively large amounts of kinetic energy. Smaller renewable energy sources, such as wind turbines and solar power generators store a much smaller amount of energy, or even no energy at all.

Typically, an electric power grid operates at a nominal grid frequency that is uniform throughout a synchronous area of the grid. For example, the UK mains supply nominally operates at 50 Hz. Grid operators are usually obliged to maintain the grid frequency to within predefined limits, for example the UK mains supply should be kept within 0.4% of the nominal 50 Hz grid frequency. If the balance between generation and consumption of electrical energy is not maintained (for example, if the total amount of generation cannot meet consumption during high demand periods, or if the output from a power generator changes, perhaps due to a fault in the generator) the net amount of energy stored in the generators of the grid can vary. This results in a change of the rotational speed of the spinning generators and a corresponding change in the operating frequency of the grid. Grid operators therefore use the system operating frequency as a measure of the balance between consumption and generation of electrical power in the grid.

A frequency response characteristic describes the response of the grid frequency to a change in balance between generation and consumption of electrical power in the grid. Examples of such frequency response characteristics include grid "stiffness" and grid "inertia".

Grid stiffness is a property of the grid describing the extent (i.e. magnitude) of grid frequency response for a given power balance change. A synchronous electric power grid with a relatively high stiffness, for example, exhibits a relatively small change in grid frequency for a given power balance change. A stiff or strong grid typically has a low grid impedance and is typical of grids where the system generation capacity is large. Whilst stiffness is in general a static property of a given grid, it should be noted that in practice, for example in large grids, the generation and consumption capacity changes frequently, for example, when new providers are added to or removed from the grid and/or from intermittent sources of generation such as wind and solar. This means that in practice, grid stiffness can be a substantially dynamic property of a grid.

Grid inertia is a measure of the amount of energy stored in the electric power grid and influences the rate at which the operating frequency of the grid changes in response to a change in grid balance. Regions of a synchronous electric power grid that have a high proportion of spinning generation typically have a large amount of energy stored as rotational kinetic energy in the generators (that is they have high inertia) and therefore have a larger capacity to maintain the operating frequency of the grid at the nominal grid frequency. In contrast, regions of a synchronous electric power grid that have a low proportion of spinning generation have a relatively low amount of stored energy (that is they have low inertia) and therefore have less capacity to maintain the operating frequency of the grid at the nominal grid frequency. Consequently, the rate of change of frequency in high inertia regions of the grid is less than it is in low inertia regions of the grid, and the "inertia" may refer to this rate of change of frequency.

Since frequency response characteristics in the grid can provide an indication of how the grid will respond to sudden changes in consumption or generation, it is useful for grid operators to understand how grid frequency response characteristics vary across the electric power grid. Conventionally, grid frequency response characteristics are determined by using phasor instrumentation to make precise and high-resolution measurements of the grid operating frequency. Since such instrumentation is expensive, it is not practical to distribute widely; typically, measurements are made at a limited number of central nodes in a transmission grid. This means that the measurement is relatively insensitive to local variation within the grid.

Further, due to the large amounts of data that the measurements produce, the measurements are often analyzed off-line. This means that there is a delay in the determination of frequency response characteristics; this makes it difficult for network operators and the like to react in a timely manner to changes in frequency response characteristics.

It is an object of the present invention to at least mitigate some of the problems of the prior art.

SUMMARY

According to a first aspect of the present invention, there is provided a method of determining, in a measurement system, a frequency response characteristic within a synchronous area of an electric power grid, electricity flowing in the grid in accordance with a grid frequency, wherein the electric power grid is connected to a first group of one or more power units each arranged to consume electric power from and/or provide electric power to the electric power grid such that a change in power provision and/or consumption by said first group of one or more power units results in a change in power flow in the electric power grid, wherein power flow to and/or from each of the power units is modulated on the basis of a sequence of control signals, thereby modulating the grid frequency to provide a frequency modulated signal according to the sequence of control signals, the method comprising: measuring, in the measurement system, a frequency characteristic relating to a frequency of electricity flowing in the electric power grid; accessing a database storing data relating to power characteristics of said one or more power units and determining, on the basis thereof, a characteristic relating to said power flow modulation; and determining a frequency response characteristic associated with at least one area of said electric power grid on the basis of the measured frequency characteristic and the said determined power flow modulation characteristic.

Measuring a characteristic of a frequency modulated signal produced by existing power units with known power characteristics within a synchronous area of an electric power grid enables real-time, or near real-time, determination of frequency response characteristics at many points within the grid, with a relatively low cost, due to the relative simplicity of the required frequency characteristic measurement device.

In some embodiments, determination of the frequency response characteristic comprises correlating the measured frequency characteristic with said power flow modulation characteristic.

In some embodiments, determining the frequency response characteristic comprises correlating the measured frequency characteristic with said power flow modulation characteristic.

In some embodiments, determining the frequency response characteristic comprises determining a ratio of said power flow modulation characteristic and the measured frequency characteristic.

In some embodiments, said power flow modulation characteristic comprises a magnitude characteristic relating to said power flow modulation.

In some embodiments, said magnitude characteristic comprises an amplitude of the power flow.

In some embodiments, the said measured frequency characteristic is measured on the basis of one or more of: a frequency of alternating voltage, a frequency of alternating current, a measured frequency of power flowing in the electric power grid; a rate of change of frequency; a period of alternating current or voltage.

In some embodiments, said measured frequency characteristic comprises a time variation in frequency associated with said modulated signal.

In some embodiments, said frequency response characteristic comprises an inertia characteristic.

In some embodiments, said inertia characteristic comprises at least one of a rise time and a fall time associated with said frequency modulated signal.

In some embodiments, said frequency response characteristic comprises a characteristic relating to a magnitude of variation in grid frequency per unit change in power balance.

In some embodiments, the first group of power units is a distributed group of power units, and there is a method comprising: modulating power flow to and/or from each of the first group of power units in accordance with a control pattern, such that the consumption and/or provision of power by the plurality of power units is coordinated to provide a collective frequency modulated signal, having a collective frequency characteristic, that is detectable by the measurement system.

Modulating power flow to and/or from each of the plurality of power units in accordance with a control pattern enables a method of collective communication to the measurement system by one up to all of the power units capable of power flow modulation connected to the electric power grid. This may be advantageous when using power units which draw small amounts of power, which individually may not be able to produce a frequency modulated signal strong enough to be detectable by the measurement system over other signals or grid noise, but which when coordinated can collectively produce a frequency modulated signal strong enough for detection at a desired point in the electric power grid. In such a way the number of localities in which frequency response characteristics may be determined may be increased.

In some embodiments, a signal specifying said control pattern to each power unit of the first group of power units is sent.

In some embodiments, the control pattern comprises a repeating pattern, and the power to and/or from the first group of one or more power units continuously according to the repeating pattern.

The control pattern comprising a repeating pattern may be advantageous for the provision of multiple opportunities for the measurement system to measure characteristics of the power flow pattern, and for averaging of successive identical power flow patterns by the measurement system to allow, for example, a higher precision in the determination of inertia in the electric power grid.

In some embodiments, power to and/or from the first group of one or more power units is controlled intermittently according to the control pattern.

The intermittent control may be advantageous for the purposes of power saving, allowing the power units to, for example, remain off when not required. This may also be advantageous for the coding of data into the power flow control pattern, and hence for communicating data to the measurement system by means of the resulting power flow pattern in the electrical power grid.

In some embodiments, there is provided a method in which said collective modulated signal includes an identifier identifying said group of power units, the method comprising: accessing a database storing one or more identifiers each associated with said first group of one or more power units; and determining a correspondence between the identifier included in the collective modulated signal and one or more of the identifiers stored in the database, thereby identifying said first group of one or more power units.

In some embodiments, each identifier stored in the database is associated with at least one area of the electric power grid and the method comprises determining an area with which the determined frequency response characteristic is associated on the basis of the determined identifier correspondence.

In some embodiments, there is provided a method in which the electric power grid is connected to a second group of one or more power units arranged to consume power from and/or provide power to the electric power grid, the method comprising: determining, on the basis of the determined frequency response characteristic, one or more parameters for use in triggering a change in consumption and/or provision of power by the second group of one or more power units; and transmitting said one or more parameters for receipt at said second group of power units.

In some embodiments, there is provided a method comprising: receiving, at the second group of power units, said one or more parameters; deriving, on the basis of the received parameters, a trigger condition; determining, based on a measured frequency characteristic of electric power flowing in the grid locally to a second group of power units, whether the trigger condition is satisfied; and in response to a determination that the trigger condition is satisfied, changing a power flow to and/or from the second group of power units.

Triggering a change in consumption and/or provision of power by power units can be useful in limiting the impact of a change in power flow elsewhere in the grid on grid frequency. Incorporating frequency response characteristics into the derivation of triggering parameters is advantageous since the frequency response characteristics provide information relating to, for example, the rate of change of grid frequency in response to a change in power flow. The triggering parameters for the power units can therefore be tailored to provide, for example, a relatively early response in the case where the local grid inertia for example is relatively low, and a relatively late response in cases where the local grid inertia for example is relatively high. This is an advantageous arrangement, since it avoids both responses that are too late in for example low inertia environments, which can lead to an unacceptable grid frequency shift, as well as responses that are too early for high inertia environments for example, which would cause unnecessary disruption to the use of the power units. Similarly, incorporating stiffness characteristics for example into the derivation of trigger parameters is advantageous since, for example, it provides an indication of the likely magnitude of the measured frequency characteristic change for a given likely power balance change.

In some embodiments, there is provided a method comprising: defining, at the measurement system, a first series of values associated with the frequency characteristic during a first time period and a second series of values associated with the frequency characteristic during a second, later, time period; determining, at the measurement system, a first polynomial function having a first set of coefficients on the basis of said first series of values and a second polynomial function having a second set of coefficients on the basis of said second series of values; and determining, at the measurement system, whether the trigger condition is satisfied on the basis of a difference between the first set of coefficients and the second set of coefficients.

In some embodiments, there is provided a method in which the electric power grid is connected to a second group of one or more power units arranged to consume power from and/or provide power to the electric power grid, the method comprising: determining, based on the determined frequency response characteristic associated with an area associated with the second group of power units, one or more parameters for use in triggering a change in consumption and/or provision of power by the second group of one or more power units; deriving a trigger condition on the basis of the measured frequency response characteristic; measuring, in an area associated with the second group of power units, a frequency characteristic relating to a frequency of electricity flowing in the electric power grid; communicating the measured frequency characteristic measured in the area associated with the second group of power units to the measurement system; determining, based on the communicated measured frequency characteristic, whether the trigger condition is satisfied; and in response to a determination that the trigger condition is satisfied, sending a request to the second group of power units to change a power flow to and/or from the second group of power units.

The above embodiment would enable the determination of whether the triggering condition is satisfied or not, for example, to be carried out at a central control center serving some or all of the electric power grid. This may be advantageous since it would enable centralized control of triggering, a centralized override of triggering, a means to centralize control of power flow at the power units, and may also enable a more cost effective method of trigger condition determination as compared to prior art methods requiring apparatus for these functions at every device.

In some embodiments, the second group of power units is the same as the first group of power units.

In some embodiments, the power modulation comprises modulation of at least one of real power and reactive power.

According to a second aspect of the present invention, there is provided a measurement system for determining a frequency response characteristic within a synchronous area of an electric power grid, wherein electricity flows in the grid in accordance with a grid frequency and the electric power grid is connected to a group of one or more power units each arranged to consume electric power from and/or provide electric power to the electric power grid such that a change in power provision and/or consumption by said power unit results in a change in power flow in the grid, wherein power flow to and/or from each of the power units is modulated on the basis of a sequence of control signals, thereby modulating the grid frequency to provide a frequency modulated signal, the measurement system being arranged to: measure a frequency characteristic relating to a frequency of electricity flowing in the electric power grid; access a database storing data relating to power characteristics of said one or more power units and determine, on the basis thereof, a characteristic relating to said power flow modulation; and determine a frequency response characteristic associated with at least one area of said electric power grid on the basis of the measured frequency characteristic and the said determined power flow modulation characteristic.

In some embodiments, the second aspect of the invention includes features corresponding to all of the features associated with the various embodiments listed above in relation to the first aspect of the invention.

According to a third aspect of the present invention, there is provided a power control device for use with one or more associated power units to provide a response to changes in a frequency of electricity flowing in a synchronous area of an electric power grid, wherein the electric power grid is connected to a measurement system arranged to determine a frequency response characteristic of the grid in said area and to determine one or more trigger parameters on the basis of the measured frequency response characteristic, the power control device being arranged to: intermittently receive one or more parameters from the measurement system, the parameters being derived from a said determined frequency response characteristic; derive, on the basis of the received one or more parameters, a trigger condition; determine, based on a measured frequency characteristic of electric power flowing in the grid, whether the trigger condition is satisfied; and in response to a determination that that the trigger condition is satisfied, change a power flow to and/or from the power unit.

In some embodiments, one of the received one or more parameters comprise said trigger condition.

In some embodiments, said frequency response characteristic comprises an inertia characteristic.

In some embodiments, said frequency response characteristic comprises a characteristic relating to a magnitude of variation in grid frequency per unit change in power balance.

In some embodiments, the power control device is arranged to: define a first series of values associated with the frequency characteristic during a first time period and a second series of values associated with the frequency characteristic during a second, later, time period; determine a first polynomial function having a first set of coefficients on the basis of said first series of values and a second polynomial function having a second set of coefficients on the basis of said second series of values; and determine whether the trigger condition is satisfied on the basis of a difference between the first set of coefficients and the second set of coefficients.

The above embodiment allows for the trigger condition to be based on the way in which the frequency is changing as a function of time. This may be advantageous since it can provide a relatively early response to a relatively fast change in frequency characteristic, which may allow a rapid restoration of the electrical power grid frequency, and alternatively provide a relatively late response to a relatively slow change in frequency characteristic, preventing unnecessary disruption to power units. It is also advantageous since it provides a means to filter out frequency characteristic fluctuations occurring on a given time scale, which may represent noise or other fluctuations which are not of interest in determining whether the triggering condition is satisfied.

In some embodiments, the first and second polynomial functions are second order polynomial functions.

In some embodiments, the frequency change event is identified on the basis of a value of at least one coefficient of the second set of coefficients differing from a corresponding coefficient in the first set of coefficients by more than a predetermined amount.

In some embodiments, the power control device is arranged to measure said series of values according to a polynomial extrapolation technique and/or conic extrapolation technique.

In some embodiments, the power control device comprises phasor measurement instrumentation arranged to measure said measured frequency characteristic on the basis of a phasor measurement.

In some embodiments the phasor measurement instrumentation is arranged to measure a phase associated with a vector of voltage measured in the electric power grid with reference to an absolute time reference.

In some embodiments, the measured frequency characteristic includes one or more of: a frequency of alternating voltage, a frequency of alternating current, a frequency of power flowing in the electric power grid; a rate of change of frequency; and a period of alternating current.

In some embodiments the power control device is arranged to receive a signal, said signal indicating a time period during which power flow may be controlled.

In some embodiments the power modulation comprises modulation of at least one of real power and reactive power.

According to a fourth aspect of the present invention, there is provided a system for responding to changes of frequency in an electric power grid, the system comprising: a distributed plurality of power control devices, each controlling a respective power unit connected to the electric power grid; and a measurement system for transmitting one or more trigger parameters to each of the plurality of distributed power control devices. In some embodiments the measurement system is arranged to: define, a plurality of groups of power control devices from said distributed plurality of power control devices; assign different respective trigger conditions to each of the plurality of groups; and transmit, to each of power control devices a trigger condition assigned to the group to which it is assigned.

In some embodiments, the measurement system is arranged to: access a power unit database storing profile information relating to the consumption and/or provision of power by the power units associated with the power control devices; and define said plurality of groups on the basis of the accessed profile information.

In some embodiments, the measurement system is arranged to: receive data indicative of a polynomial function representative of a measured frequency characteristic; extrapolate, based on said polynomial function, future expected values associated with the measured frequency characteristic; and determine, on the basis of the extrapolated future expected values, an expected power flow requirement for responding to the frequency change event.

The forecasting of a frequency characteristic provided for in the above embodiment is advantageous as it allows more time to organize an efficient response to a change in frequency characteristic which may result in a trigger condition being satisfied. This forecasting is also advantageous since it provides a means compensate for a frequency characteristic change which is likely to happen in the near future, rather than compensating for changes which have happened already, which allows for a tighter control of the frequency characteristic.

In some embodiments, the measurement system is arranged to: access a power unit database comprising profile information relating to the consumption and/or provision of power by the power units; define, on the basis of the expected power flow requirement and said profile information, one or more groups of one of more power units for responding to the frequency change event.

In some embodiments, the measurement system is arranged to transmit one or more requests, for receipt at the power control devices of the defined groups, to control consumption and/or provision of electrical power by the power units associated with power control devices, thereby varying a net consumption of electrical energy in said area.

According to a fifth aspect of the present invention, there is provided a power control device for use with one or more associated power units to provide a response to changes in a frequency of electricity flowing in an electric power grid, wherein electricity flows in the electric power grid in accordance with a grid frequency, the power control device comprising a frequency measurement device and being arranged to: monitor, using said frequency measurement device, changes in said grid frequency at the power control device; based at least partly on said monitoring, determine a trigger condition; determine, based on a measured frequency characteristic of electric power flowing in the grid, whether the trigger condition is satisfied; and in response to a determination that that the trigger condition is satisfied, change a power flow to and/or from the power unit.

In some embodiments, the power control device is arranged, responsive to the measured frequency characteristic crossing a threshold value, to: perform an analysis of the measured frequency characteristic at times preceding said threshold value being crossed; and determine said trigger condition at least partly on the basis of said analysis.

In some embodiments the power control device is arranged to: monitor, using said frequency measurement device, changes in the grid frequency at the power control device subsequent to the derivation of said trigger condition, and based on the subsequent monitoring, derive an updated trigger condition.

In some embodiments, the derivation of the updated trigger condition is based in part on said first trigger condition.

In the above embodiments, the device is able to control power flow based on a trigger condition which it itself has derived. This device would be advantageous, for example, in areas of the electric power grid which may not have access to communication networks, or in cases where command via these networks is not cost effective.

Further features and advantages of the invention will become apparent from the following description of preferred embodiments of the invention, given by way of example only, which is made with reference to the accompanying drawings.

DETAILED DESCRIPTION OF CERTAIN INVENTIVE EMBODIMENTS

Figure 1:
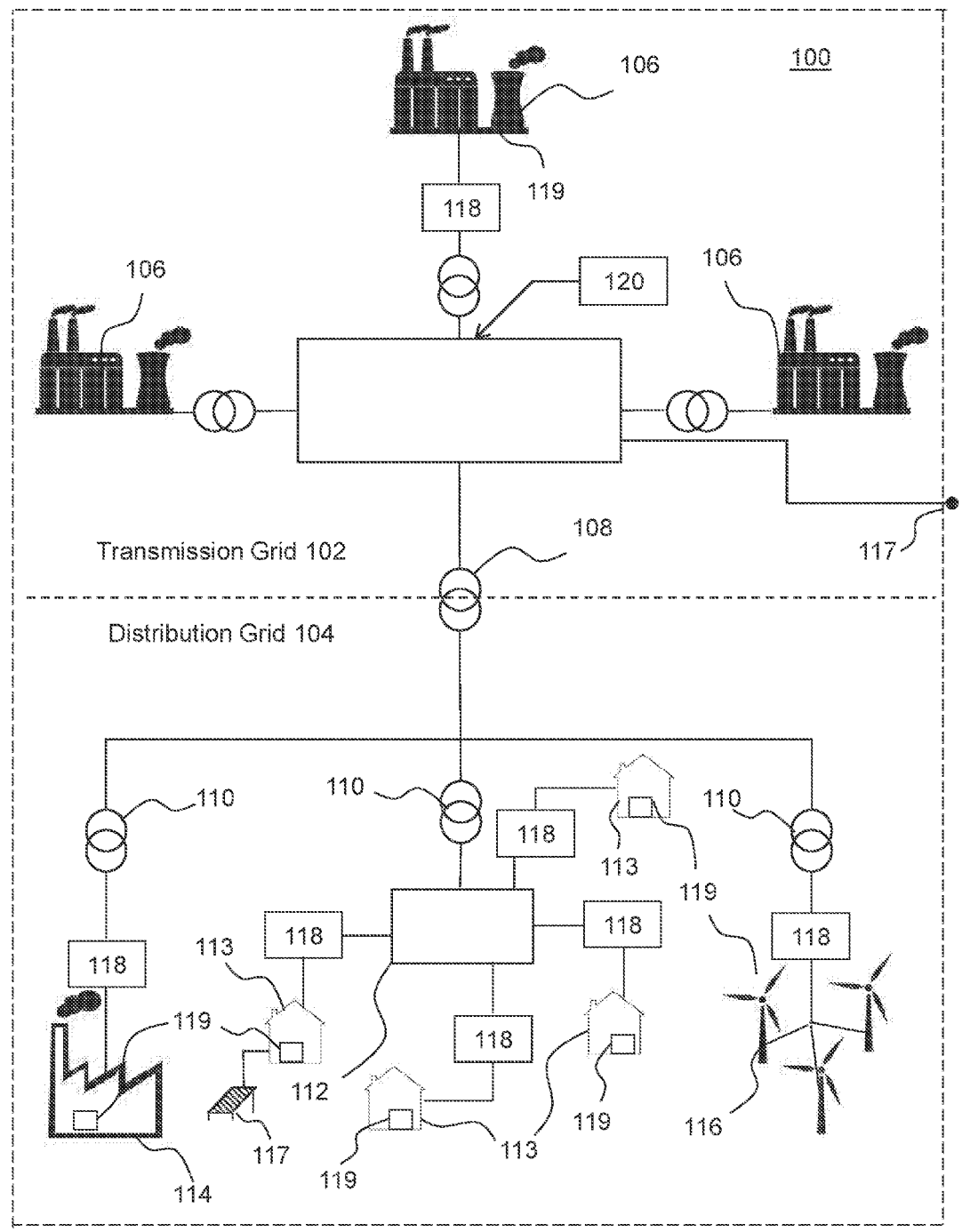
FIG. 1 is a schematic diagram illustrating a synchronous electric power grid in which the invention may be implemented.

Supply of electricity from providers such as power stations, to consumers, such as domestic households and businesses, typically takes place via an electricity distribution network or electric power grid. FIG. 1 shows an exemplary electric power grid 100, in which embodiments of the present invention may be implemented, comprising a transmission grid 102 and a distribution grid 104.

The transmission grid 102 is connected to power generators 106, which may be nuclear plants or gas-fired plants, for example, from which it transmits large quantities of electrical energy at very high voltages (typically of the order of hundreds of kV), over power lines such as overhead power lines, to the distribution grid 104.

The transmission grid 102 is linked to the distribution grid 104 via a transformer 108, which converts the electric supply to a lower voltage (typically of the order of 50 kV) for distribution in the distribution grid 104.

The distribution grid 104 is connected via substations 110 comprising further transformers for converting to still lower voltages to local networks which provide electric power to power consuming devices connected to the electric power grid 100. The local networks may include networks of domestic consumers, such as a city network 112, that supplies power to domestic appliances within private residences 113 that draw a relatively small amount of power in the order of a few kW. Private residences 113 may also use photovoltaic devices 117 to provide relatively small amounts of power for consumption either by appliances at the residence or for provision of power to the grid. The local networks may also include industrial premises such as a factory 114, in which larger appliances operating in the industrial premises draw larger amounts of power in the order of several kW to MW. The local networks may also include networks of smaller power generators such as wind farms 116 that provide power to the electric power grid.

Although, for conciseness, only one transmission grid 102 and one distribution grid 104 are shown in FIG. 1, in practice a typical transmission grid 102 supplies power to multiple distribution grids 104 and one transmission grid 102 may also be interconnected to one or more other transmission grids 102.

Electric power flows in the electric power grid 100 as alternating current (AC), which flows at a system frequency, which may be referred to as a grid frequency (typically 50 or 60 Hz, depending on country). The electric power grid 100 operates at a synchronized frequency so that the frequency is substantially the same at each point of the grid.

The electric power grid 100 may include one or more direct current (DC) interconnects 117 that provide a DC connection between the electric power grid 100 and other electric power grids. Typically, the DC interconnects 117 connect to the typically high voltage transmission grid 102 of the electrical power grid 100. The DC interconnects 117 provide a DC link between the various electric power grids, such that the electric power grid 100 defines an area which operates at a given, synchronized, grid frequency that is not affected by changes in the grid frequency of other electric power grids. For example, the UK transmission grid is connected to the Synchronous Grid of Continental Europe via DC interconnects.

The electric power grid 100 also includes one or more devices for use in modulating an operating frequency of the electric power grid 100 (herein referred to as "frequency modulation devices" 118) and a measurement system in the form of a measurement device 120 arranged to measure a characteristic relating to the operating frequency of the grid (hereinafter referred to as the grid frequency).

Each frequency modulation device 118 is associated with a power unit 119 (which may consume power from or provide power to the electric power grid 100) or a group of power units 119 and is arranged to modulate power flow to and/or from the power unit 119 or group of power units 119 as described below with reference to FIG. 2a. The frequency modulation devices 118 may be provided separately to, and/or installed on, the power units 119. The power units 119 may include power generators 106, appliances in residential premises 113 or industrial premises 114 and/or a small-scale power generators such as wind turbines 116 or solar panels 117. It may be advantageous in this context for the power units 119 to have low inertia to enable effective modulation of the power flow.

The one or more frequency modulation devices 118 may be located at power units 119 in the distribution grid 104 or in the transmission grid 102, or at any other location of the electric power grid 100. The frequency modulation devices 118 operate with the power units 119 to transmit code sequences within the electric power grid 100. Although, for the sake of simplicity, only seven frequency modulation devices 118 are shown in FIG. 1, it will be understood that, in practice, the electric power grid 100 may comprise hundreds or thousands of such devices, depending upon the capacity of power units 119 with which the frequency modulation devices 118 are associated. Furthermore, it will be understood that although, for the sake of simplicity, only one measurement device 120 is shown in FIG. 1, in practice multiple measurement devices 120 may operate in the same synchronous electric power grid 100. Where frequency modulation devices 118 are associated with large capacity power units 119 (such as a power unit in an industrial premises) there may only be a small number of frequency modulation devices 118 in the electric power grid 100. In some embodiments, there may only be one frequency modulation device 118 in the electric power grid 100.

The frequency modulation devices 118 may be distributed among a relatively large number of smaller capacity power units 119 (each providing, for example, a few W to tens of kW, such that the contribution to the frequency modulation by each power unit 119 is smaller but so that a combined frequency modulation signal has the same strength as a single larger power unit 119. Distribution of the frequency modulation devices 118 has the advantage that the switching of smaller loads can be performed without the need for expensive power switching apparatus (switching can instead be performed with semiconductor-based switches, for example, which may be mass produced), and the switching of smaller loads only introduces a relatively small amount of voltage noise into the local grid environment so that, for example, the supply voltage stays within limits.

Typically, the total modulated load required to transmit a frequency modulated signal across the electric power grid 100 is dependent on the particular coding scheme used for transmitting information, as described below. Different coding schemes result in different amounts of gain at the measurement device 120 and hence the required power for modulation may range significantly, for example from W to MW.

The frequency modulation devices 118 each modulate the power flow to and/or from respective associated power units 119. Where there is more than one frequency modulation device, each of the one or more frequency modulation devices 118 may be synchronized with each of the other frequency modulation devices 118 and arranged to modulate power flow according to a control pattern such that the frequency modulation devices 118 cause a collective modulation of the power flow in the electric power grid 100. That is, the frequency modulation devices 118 collectively cause a modulated change in power balance in the electric power grid 100, the change in power balance being the combined effect of the modulated power flow to/from each of the power units 119 that have an associated frequency modulation device 118.

The frequency modulation devices 118 may be arranged to modulate a reactive power flow to and/or from their associated power units 119. For example, the frequency modulation devices 118 may include inverters for modifying a reactive power contribution of their associated power units 119. Modulating the reactive power contribution of the power units causes a local modulation of the efficiency of the electric power grid 100 with a corresponding modulation of the available real power. In turn, these cause a modulation of the grid balance which as described above causes a modulation of the grid frequency.

In certain embodiments the frequency modulation devices 118 may be arranged to modulate just real power, just reactive power, or both real and reactive power.

Figure 2A:
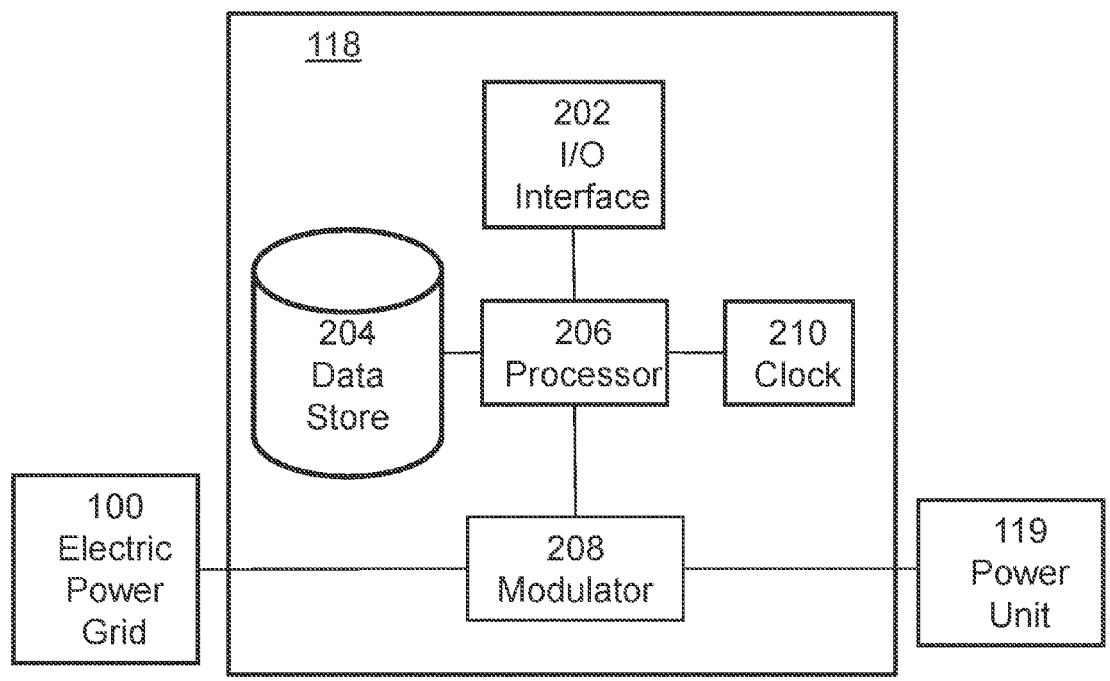
FIG. 2a is a schematic diagram illustrating a frequency modulation device.

FIG. 2a shows an exemplary arrangement of a frequency modulation device 118. The frequency modulation device 118 forms an interface between the electric power grid 100 and one or more power units 119 and operates with the one or more power units 119 to propagate a frequency modulated signal within the electric power grid 100. The frequency modulation device 118 comprises an input/output (I/O) interface 202, a data store 204, a processor 206, a modulator 208, and a clock 210.

The frequency modulation device 118 is arranged to receive data from a controller via the I/O interface 202. The controller may be part of the measurement device 120. Alternatively, the controller may not be directly connected to the electric power grid 100 but instead the data may be received via the I/O interface 202. The I/O interface 202 is arranged to receive information via a fixed or wireless communications network, which may include one or more of Global System for Mobile Communications (GSM), Universal Mobile Telecommunications System (UMTS), Long Term Evolution (LTE), fixed wireless access (such as IEEE 802.16 WiMAX), and wireless networking (such as IEEE 802.11 Wi-Fi).

Information received via the I/O interface 202 may be stored in the data store 204. Information stored in the data store 204 may include representations of a control sequence in accordance with which the grid frequency is to be modulated by the frequency modulation device 118 (referred to herein as "codes"). The codes may represent control signals for controlling the modulator 208 according to a predefined control pattern.

The processor 206 is arranged to retrieve the codes from the data store 204 and to generate control signals for controlling the modulator 208. The processor 206 accesses the data store 204, retrieves a code and, based on the code, generates control signals and sends those control signals to the modulator 208 to control power flow to/from a power unit 119. The control signals may be in the form of a bit pattern of a signal that is to be propagated in the electric power grid 100. The code typically defines a time-varying pattern of control signals provided with reference to the clock 210. The clock 210 may be synchronized with the clocks of other frequency modulation devices 118 in order that each of the frequency modulation devices 118 connected to the electric power grid 100 is synchronized with each other frequency modulation device 118. This enables propagation of frequency modulated signals to be initiated at each frequency modulation device 118 at the same time. Synchronization of the clock 210 may be performed on the basis of a synchronization signal received via the (I/O) interface 206, or by any other means.

The modulator 208 is arranged to modulate power flow to/from a power unit 119 in response to the control signals generated by the processor 206. The modulator 208 may comprise a switch for connecting/disconnecting the power unit 119 to/from the electric power grid 100 and/or any electrical or electronic means allowing power flow to/from the power unit 119 to be modulated. For example, the power unit 119 may not necessarily be completely turned off during modulation but may instead be modulated between set points of power consumption and/or provision. The modulator 208 may be an attenuator or some other means for altering the power consumption/provision by the power unit 119 (for example, inverter-based chargers for electric vehicles and/or other electric devices, grid-tie inverters for photovoltaic generators, Combined Heat and Power (CHP) generators, or wind generators.

Modulating the grid power balance induces a modulation in the grid frequency that in a synchronous electric power grid is the same throughout the entire electric power grid.

Figure 2B:
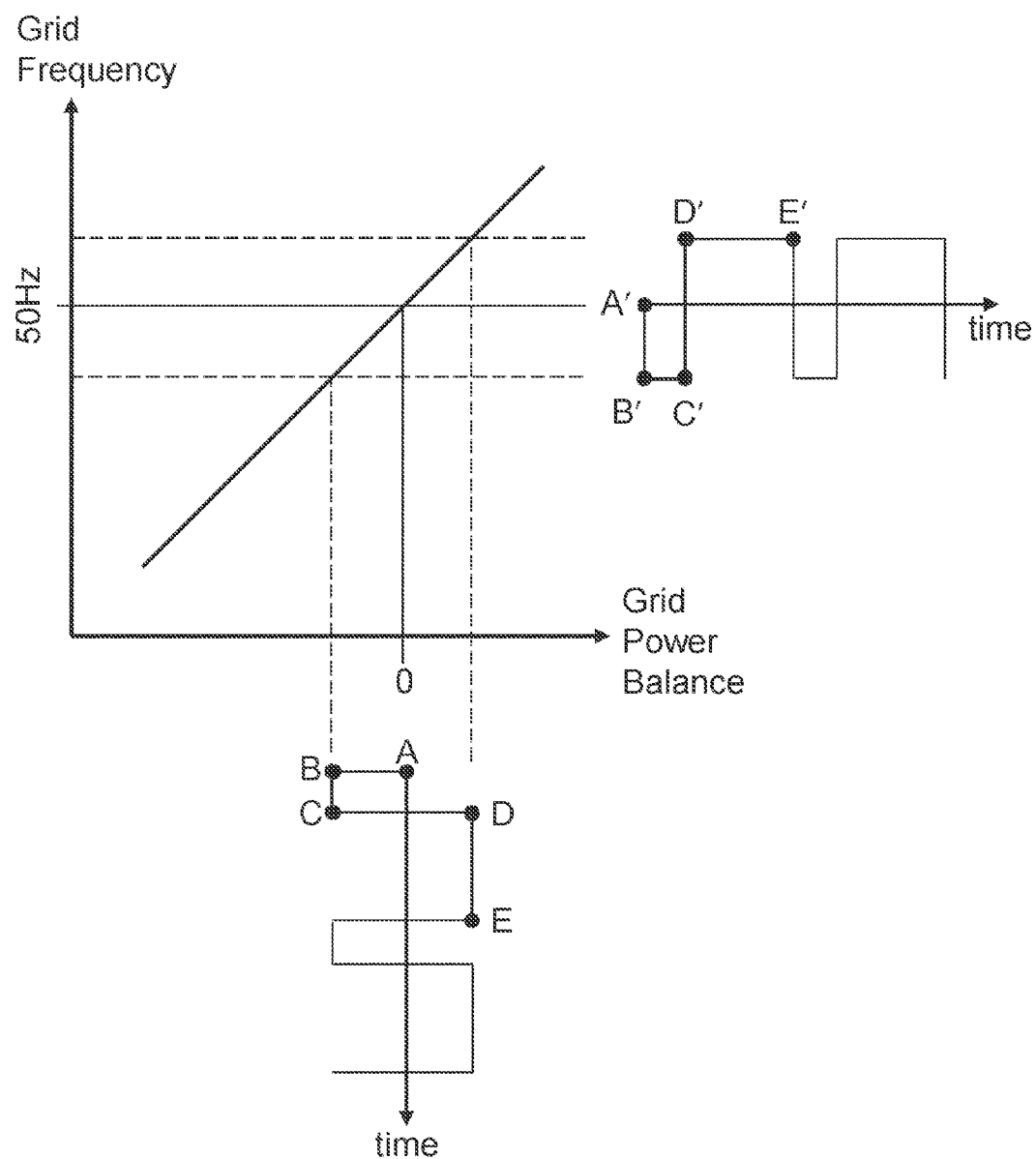
FIG. 2b is a diagram illustrating the relationship between modulated power generation/consumption balance and the resulting grid frequency modulation in an electric power grid.

For example, considering FIG. 2b, which depicts a theoretical inertia-less electric power grid, at point A the electric power grid 100 is balanced (that is, the total demand for electric power is approximately equal to the total amount of power being generated in or provided to the electric power grid 100) and the grid frequency is stable at, for example, 50 Hz. At point B, the grid power balance is shifted such that there is excess consumption from point B to point C. This results in a corresponding fall in the grid frequency at point B', which is maintained until point C'. At point C, the grid power balance is shifted such that there is excess generation at point D, which is maintained until point E. This results in a corresponding rise in the grid frequency between points C' and D', which is maintained from point D' to point E'. The extent to which the grid frequency changes in response to a given change in grid power balance is characterized by the grid stiffness, and is represented as the gradient of the straight line in the graph of FIG. 2b. That is, for example, in FIG. 2b, a relatively stiff grid would have a line with a relatively small gradient, such that a relatively large grid power balance change would only result in a relatively small grid frequency change. It should be noted that although the relationship between grid frequency change and grid power balance change is generally monotonic, it may depart from the linearity as depicted in FIG. 2b, and may have, for example, some curvature, at some times.

Typically, the maintenance of the increased grid frequency between, for example, points D' and E' depends on a modulation frequency (i.e. the frequency at which power flow is modulated). In particular, the increased grid frequency may be maintained where the modulation period (the inverse of the modulation frequency) is less than a characteristic reaction time for automatic correction and/or for the grid operator to react to changes in grid power balance. In embodiments where the power flow is modulated relatively quickly, power balance compensation mechanisms employed automatically and/or by the grid operator cannot react quickly enough to counteract the modulation, whereas where the power flow is modulated relatively slowly, the power balance compensation mechanisms may begin to degrade the effect of the intended modulation by the compensation mechanism counteraction.

Typically, the amplitude of the grid frequency modulation is in the range of μHz up to several MHz and so does not exceed the agreed limits within which grid operators must maintain the grid frequency (the nominal system frequency) and does not cause the grid operator to initiate any manual or automatic grid balancing measures in response to the modulation. Furthermore, modulating the grid frequency at a rate that is less than the grid frequency avoids attenuation of the frequency modulated signal by transformers 108, 110 in the electric power grid 100.

The modulator 208 is typically arranged to modulate power flow to/from the power unit 119 at a modulation frequency typically up to 10 Hz (though, again, this depends on the nature of each electric power grid). In some embodiments, power flow to and/or from a power unit 119 is modulated at a modulation frequency of less than half of the predefined grid frequency. In some embodiments, power flow is modulated at a modulation frequency less than a quarter of the predefined grid frequency. In some embodiments, power flow is modulated at a modulation frequency less than a tenth of the predefined grid frequency.

At this frequency range, switching of moderately high loads is possible. Because the modulator 208 modulates power flow to/from the power unit 119 at a modulation frequency less than the grid frequency, the modulated signal is not inhibited by the infrastructure of the electric power grid 100 any more than an un-modulated AC electrical power would be. This removes the need to provide an additional communications route around devices such as transformers 108, 110 as is required by Powerline Communications systems which overlay a High Frequency (100's Hz up to MHz) signal onto the base system (e.g. 50 Hz) frequency.

It should be noted that it may be advantageous to modulate the power flow to/from a power unit at a zero-crossing of the AC waveform. For example, in the case where the modulation comprises turning the power flow to/from the device on and off, the transitions between on and off may be made at the zero-crossing point. This minimizes the generation of unwanted harmonics subsequently distributed into the electric power grid, and hence minimizes unnecessary grid noise due to the modulation.

Although the frequency modulation device 118 is shown in FIG. 2a as being separate to the power unit 119, it will be understood that in some embodiments the frequency modulation device 118 may be integral to power unit 119.

It should be noted that, although the codes are described above as being stored in the data store 204 of the frequency modulation device 118, in some embodiments they may be stored remotely (for example at the controller) and accessed by the frequency modulation device 118 when required. For example, the codes may be transmitted to the frequency modulation device 118, in which case they may not be stored at the frequency modulation device 118, or stored only in a temporary data store.

Modulation of power flow by the frequency modulation device 118 causes a corresponding modulation of the grid frequency, which is the same throughout a given synchronous electric power grid 100.

As explained below with reference to FIG. 4, the frequency response for a given power flow modulation is dependent on the frequency response characteristics local to the frequency modulation device or devices 118 providing the power modulation.

Since the grid frequency is the same throughout the electric power grid 100, the modulated frequency is also the same throughout the electric power grid 100 and so a measurement device 120 able to detect the modulated grid frequency is able to measure the modulated frequency signal at any point at which it can be connected to the grid 100.

Figure 3:
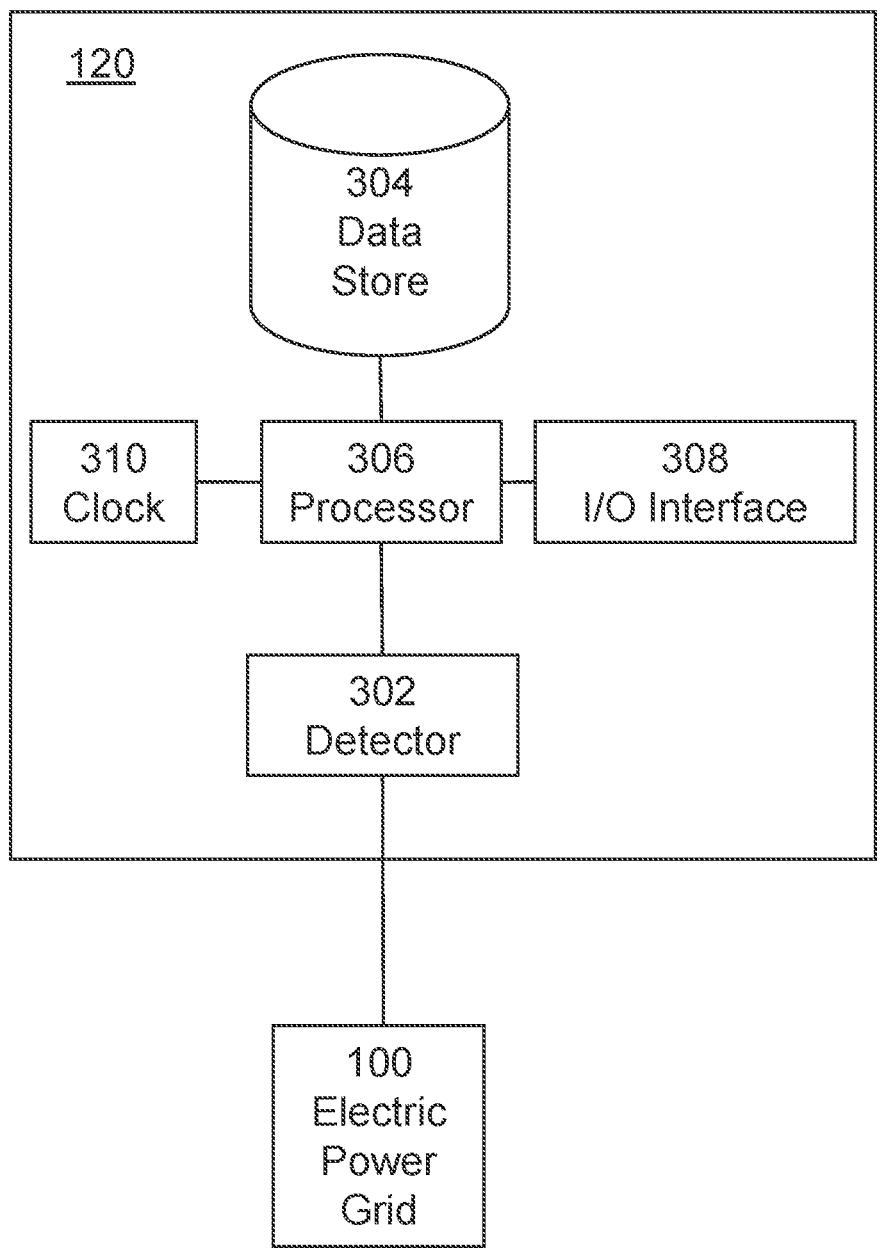
FIG. 3 is a schematic diagram illustrating a measurement device.

FIG. 3 is a diagram illustrating an exemplary measurement device 120 configured to measure a modulated frequency signal propagated within an electric power grid 100. The measurement device 120 comprises a detector 302, a data store 304, a processor 306, an input-output (I/O) interface 308, and a clock 310.

The detector 302 may be any device capable of detecting or measuring a characteristic relating to the grid frequency with sufficient precision.

In some embodiments, a time period relating to the grid frequency is used as a characteristic measure of the grid frequency. For example, a measurement of the half-cycle, which is the period between times at which the voltage crosses 0V, may be used as a characteristic relating to the grid frequency.

In some embodiments, the instantaneous grid frequency, corresponding to the inverse of the time it takes to complete a half-cycle (or a full-cycle) may be determined. The frequency data may be equalized and digitally filtered to remove frequency components outside a known and desired range of signal frequencies. For example, frequency components corresponding to the grid frequency and/or frequency components relating to noise may be removed.

In an embodiment, the detector 302 may comprise a voltage detector arranged to sample the voltage at a frequency higher than the grid frequency and an analogue to digital converter arranged to convert the sampled voltage to a digital voltage signal. For example, the voltage detector may be arranged to sample the voltage 1000 times per cycle. The digital voltage signal may then be processed to determine with a high degree of precision (within the range μs to ms) the times at which the voltage crosses 0V.

In another embodiment, the detector 302 may comprise a current detector arranged to sample the current at a frequency higher than the grid frequency, and an analogue to digital converter arranged to convert the sampled current to a digital current signal, which may then be processed to determine with a high degree of precision (within the range of, for example, μs to ms) the times at which the current crosses 0V, or other characteristics associated with the current waveform.

In still another embodiment, the detector 302 may comprise both a voltage detector and a current detector. Measuring the times at which both the voltage and current crosses 0V enables the measurement device 120 to determine a change in the relative phase of the voltage and current, thereby enabling the measurement device 120 to compensate for changes in reactive power in the grid. This in turn enables a more accurate measurement of frequency (or a characteristic relating to frequency).

In addition to, or as an alternative to, measuring the grid frequency, the detector 302 may measure a rate of change of frequency of power flowing in the grid based on measurements of voltage and/or current, as described above.

The data store 304 may store data indicating the power modulation pattern used by the one or more frequency modulation devices 118; for example it may indicate a square wave pattern, as described below in relation to FIGS. 4a to 4d. The processor 306 may use the stored data pattern format to aid extraction of the frequency modulated signal from the measured frequency signal by correlating the stored data pattern format with the measured frequency signal. The measurement device 120 may include a correlator arranged to correlate the measured frequency signal with a known modulation pattern to identify transitions between high and low states in a digital frequency modulated signal. This enables the modulated signal to be extracted from the measured frequency even when the amplitude of the modulated signal (which, as described above, could be up to several MHz) is less than the level of noise in the grid frequency (which is typically in the range of 10 to 200 MHz). These typical values vary significantly from one synchronous grid to another and in a given synchronous grid over time.

The data store 304 may also store identification data relating to one or more power units 119, or one or more groups of power units 119 (or their associated frequency modulation devices 118). Such identification data, hereinafter referred to as identifiers, may be used to identify the source of a frequency modulated signal as described below. The identifiers may correspond to the "codes" mentioned above; in other words, the groups of power units 119 (or their associated frequency modulation devices) may be identified by the frequency modulation pattern that they produce.

The data store 304 also stores data relating to one or more power characteristics of the power units whose electric power consumption and/or provision is modulated by the frequency modulation devices 118, and associations between this data and the identifiers mentioned above. The data store 304 may also store data indicating an area of the grid at which frequency modulation devices 118 are located (such as a country, county, city or postcode), and associations between this data and the identifiers mentioned above.

The data store 304 may be used to store measured and extracted frequency modulated signal data that has been propagated within the electric power grid.

The processor 306 may be any processor capable of processing data relating to a frequency characteristic of electricity flowing in the electric power grid 100. The processor may include, but not be limited to, one or more of an application specific integrated circuit (ASIC), a field programmable gate array (FPGA), a digital signal processor (DSP), and a general-purpose programmable processor.

The processor 306 is configured to process the data relating to the measured frequency characteristic to determine frequency response characteristics within a synchronous area of the electric power grid 100. In particular, the processor 306 is configured to access the data store 304 to retrieve the data relating to power characteristics of one or more power units 119, whose electric power consumption and/or provision is modulated by the frequency modulation devices 118, and to determine a characteristic relating to power flow modulation of the one or more power units 119. Based on the measured frequency characteristic and the determined power flow characteristic, the processor determines frequency response characteristics associated with at least one area of the electric power grid 100.

Figure 4A:
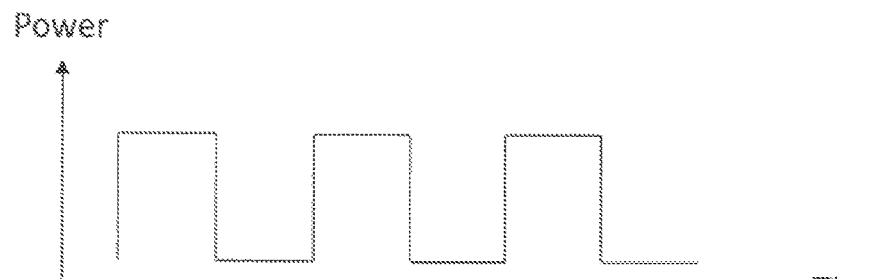
FIG. 4a is a graph showing an exemplary square-wave power modulated signal.
Figure 4B:
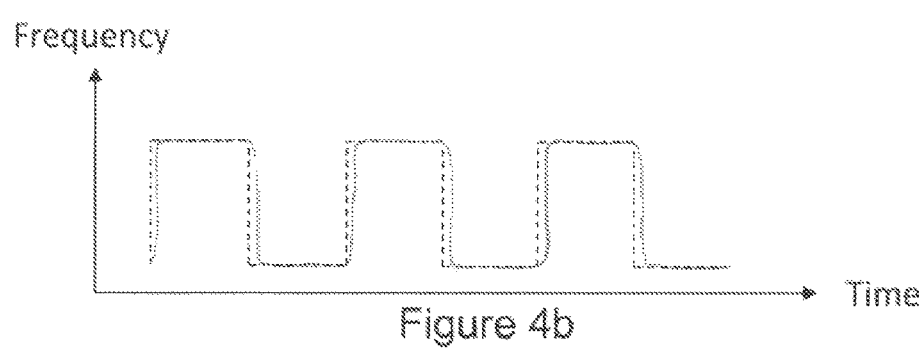
FIG. 4b is a graph showing a frequency modulated signal in a low inertia region of an electric power grid.
Figure 4C:
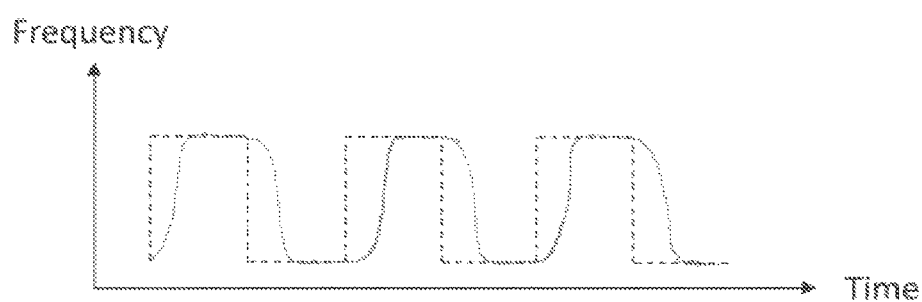
FIG. 4c is a graph showing a frequency modulated signal in a medium inertia region of an electric power grid.
Figure 4D:
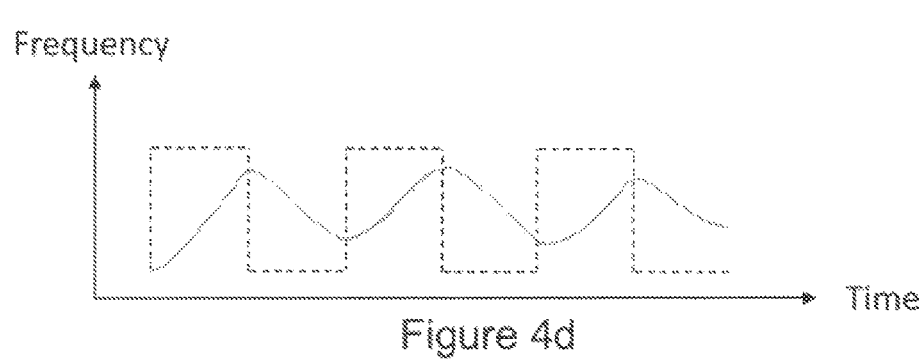
FIG. 4d is a graph showing a frequency modulated signal in a high inertia region of an electric power grid.

FIG. 4a shows a plot of an exemplary power modulated signal provided by a frequency modulation device 118, and FIGS. 4b to 4d show corresponding plots of frequency modulated signals for regions of a synchronous electric power grid that have low, medium and high amounts of inertia. In particular, FIG. 4a shows a square wave power modulated signal that has a constant period and a duty cycle of 50%.

In each of FIGS. 4b to 4d, the dotted line represents the waveform of the variation in power flow, with the solid line showing the corresponding frequency variation. Note that the electric power grid for each of FIGS. 4b to 4d has the same stiffness, meaning that given sufficient time, the extent of frequency change in response to a given change in power balance would be the same. The electric power grids represented in these graphs do, however, have varying inertia, which is the cause of their varying form of frequency response for the given power flow variation.

FIG. 4b shows the frequency variation resulting from power modulation in regions of the electric power grid that have relatively low inertia. The frequency modulated signal corresponds closely to the power modulated signal.

FIG. 4c shows the frequency variation resulting from power modulation in regions of the electric power grid that have a medium amount of inertia. The frequency modulated signal is modified compared to the power modulated signal and therefore corresponds less closely to the power modulated signal than that of FIG. 4b. In particular, the rate at which the frequency changes is slower than that shown in FIG. 4b and therefore the frequency modulated signal appears delayed and smoothed with respect to the input power modulated signal of FIG. 4a.

FIG. 4d shows the frequency variation resulting from power modulation in regions of the electric power grid that have relatively high inertia. The frequency modulated signal is heavily modified compared to the power modulated signal. In the particular example shown, the degree of delay and smoothing is such that in the time frame of the power modulated signal, the frequency modulated signal does not reach its maximum value before the power modulation next switches.

Thus, by determining parameters relating to the form of the frequency modulated signal resulting from an identified power unit 119 (or group thereof), and comparing this with the known characteristics of the power flow modulation producing the signal (as identified by accessing the data store 304), the measurement device 120 is able to determine an inertia in the area of the grid in which the power device 119 (or group thereof) is located. Further, an analysis of the extent of frequency change in response to a known power modulated signal also enables the measurement device to determine the grid stiffness.

Using the measurement method described above, a grid system operator (or other party) is able to determine frequency response characteristics representative of the entire synchronous electric power grid 100 and/or of local, regional areas of the synchronous electric power grid. Thus, the grid system operator can assess the frequency response characteristics in the various regions of the electric power grid 100 and, on the basis of those characteristics, plan for future changes in grid balance. Furthermore, the determined frequency response characteristics can be used by the measurement device 120 for automatic or semi-automatic control of power units in the electric power grid 100 to provide corrective measures to changes in grid frequency, as described below.

The frequency response characteristic measurements described above may be used to predict future changes in frequency response characteristics in geographically adjacent areas utilizing measured frequency response characteristics and available additional information including, for example, current and predicted weather information and/or characteristics of electricity generation in the relevant area, such as the mix of renewable to non-renewable generation sources (based on the fact that renewable sources tend to have, for example, relatively low inertia).

The frequency response characteristics referred to above may be a relative indication of, for example, the inertia or stiffness of the grid, based on a relative frequency response with respect to a power flow modulation. Such an indication may provide qualitative information regarding the inertia or stiffness of the grid without necessarily determining their absolute quantitative values. An indication of a frequency response characteristic, may, for example, be determined by correlating the measured frequency characteristic with a magnitude characteristic of the power flow modulation using a cross-correlation, or other correlation process. Alternatively, an indication of stiffness may be determined by determining a ratio of the characteristic of a magnitude and the measured frequency characteristic.

Alternatively or additionally the frequency response characteristics may comprise an absolute numerical value of inertia and/or stiffness.

As an example, an inertia characteristic may be determined by analyzing a time variation of a frequency characteristic, for example, by analyzing the impulse response of grid frequency resulting from an impulse resulting from a known modulation of power flow in the electric power grid. The response in grid frequency as a function of time may, for example, be fitted by an exponential function with a characteristic time constant. If the power flow impulse corresponds to an increase in power flow, the time constant corresponds to a "rise time", and if the power flow impulse corresponds to a decrease in power flow, the time constant corresponds to a "fall time". A characteristic relating to inertia may then be defined, for example, to be proportional to this rise time or fall time, and hence longer rise and/or fall times indicate regions of the electric power grid with a larger inertia.

As a further example, a stiffness characteristic may be determined by analyzing the magnitude of a frequency characteristic change in response to a known magnitude of power balance change. This could comprise, for example, the determination of the ratio of the measured magnitude of the impulse response of grid frequency (for example in units of Hz) to the known magnitude of impulse of power flow (for example in units of W) which caused it, giving rise, in this example, to a stiffness characteristic with units of Hz W-1.

The characteristic of magnitude relating to the power flow modulation provided by the one or more power units 119 referred to above may, for example, be an amplitude of the power modulation provided by one power unit 119 and its corresponding frequency modulation device 118 or, as described in more detail below, where more than one power unit 119 and its associated one or more frequency modulation devices 118 are used to provide a frequency modulated signal, the magnitude characteristic may be a summed amplitude of modulation of all the modulated power units 119.

In some embodiments, the power flow of a group, such as a distributed group, of power units 119 may be modulated in a coordinated way by their corresponding frequency modulating devices 118 in accordance with a single control pattern. In this way, the consumption and/or provision of power by the group of power units 119 is coordinated to provide a collective frequency modulated signal having a collective measured frequency characteristic that is measurable/detectable by the measurement device 120. As described above, this enables the switching of smaller loads to be performed by removing the need for expensive power switching apparatus (switching can instead be performed with semiconductor-based switches, for example, which may be mass produced), and also only introducing a relatively small amount of voltage noise into the local grid environment.

In order that the resulting frequency modulated signal from each member of the group constructively combines with that from the other members, the use of the codes may be synchronized i.e. the processor 206 of each group member should activate the code in coordination (e.g. substantially simultaneously) with the other members of the group. This could be achieved in a number of ways; for example, the clocks 210 of each frequency modulating devices 118 could be synchronized, and the devices 118 configured to activate the code at a predetermined time.

By coordinating the frequency modulated signal from a group of devices, it is possible to produce a magnitude of signal that is more readily detectable by the measurement device 120.

The group of power units 119 (and/or their corresponding frequency modulation devices 118) may be grouped on the basis of their location such that power units 119 in a particular area or region, or at a particular location in the electric power grid 100 are collectively modulated to propagate a collective frequency modulated signal at the same. Grouping power units 119 (or their associated frequency modulation devices 118) in this way enables the measurement device 120 to determine local frequency response characteristics for that particular area or region, or location in the electric power grid 100.

In order to enable a frequency modulated signal propagated by a given group to be distinguished from the background variation in grid frequency and/or from frequency modulated signals from other groups, as mentioned above, the measurement device 120 may store, in a data store 304, codes (hereinafter referred to as identifiers) each associated with one or more frequency modulation devices 118 and the frequency modulation devices 118 may include information relating to their respective identifier in frequency modulated signals propagated in the electric power grid 100.

Each frequency modulation device 118 in a given group may be provided with data indicative of the identifier associated with that frequency modulation device 118, and may generate control signals according to which each of the power units 119 in the group is modulated that correspond with or include the identifier assigned to that group. In this way the frequency modulation devices 118 include the identifier in frequency modulated signals that are propagated in the electric power grid 100. To identify the group of power units, the measurement device 120 may access a database (for example, in a data store 304 of a measurement device 120) storing one or more of the identifiers associated with the group of power units 119 (or their associated frequency modulation devices 118) and determine a correspondence between the identifier included in a measured collective frequency modulated signal and one or more of the identifiers stored in the database. For example, the measurement system device 120 may correlate the frequency modulated signal (including the identifier) with its stored identifiers to perform this identification.

In order to enable the measurement device 120 to distinguish between frequency modulated signals from different groups, or from different specific areas, it is useful for the identifiers to be orthogonal or quasi-orthogonal, and result in orthogonal or quasi-orthogonal frequency modulated signals; that is, a respective pattern associated with a given group is not correlated with patterns associated with other groups, or is only very weakly correlated therewith. Moreover, the codes associated with different groups or different areas of the grid may be orthogonal or quasi-orthogonal.

The control patterns may be programmed into each frequency modulation device 118 at the time of manufacture or installation. Alternatively or in addition, control patterns may be provided to the power units' frequency modulation devices 118 via a communication network by the measurement device 120. For example, the control patterns may be provided as an update to an existing control pattern stored in the data store 204 of the frequency modulation device 118.

The control patterns may include a repeating pattern, according to which the frequency modulation device 118 continuously controls power flowing to and/or from the power unit 119. Alternatively, the frequency modulation device 118 may control power flowing to and/or from the power unit 119, according to the control pattern, intermittently.

Frequency modulated signals propagated by each of the frequency modulation devices 118 or groups of frequency modulation devices 118 may be separated (to be orthogonal or quasi-orthogonal in time) based on a time difference. Each of the groups of frequency modulation devices 118 may start propagating a frequency modulated signal in the electric power grid that is measurable by the measurement device 120 at a random start time. For example, frequency modulation devices 118 located in different geographical areas may be arranged to, or requested to, propagate a frequency modulated signal within the electric power grid 100 at a particular time or within a particular time-frame. In order to prevent each of the frequency modulation devices 118 propagating a frequency modulated signal at the same time, the measurement device 120 may be arranged such that distributed frequency modulation devices 118 each have sufficiently different modulation start times to each of the other frequency modulation devices 118. For example, the frequency modulation devices 118 may be arranged to add a random time delay to the time at which they receive a request to propagate a frequency modulated signal. This increases the likelihood that the frequency modulated signals by each of the frequency modulation devices 118 is measured by the measurement device 120 at sufficiently separated times (that is, times separated by more than the length of time it takes to propagate the signal) so that the measurement device 120 can distinguish between signals propagated by different frequency modulation devices 118.

Each frequency modulation device 118 may determine the random time delay based on information that is unique to that frequency modulation device 118. For example, the random time delay may be determined based on a serial number of the frequency modulation device 118. This reduces the likelihood of two or more frequency modulation devices 118 using the same time delay, and therefore facilitates separation at the measurement device 120 of signals propagated by different frequency modulation devices 118.

Figure 5:
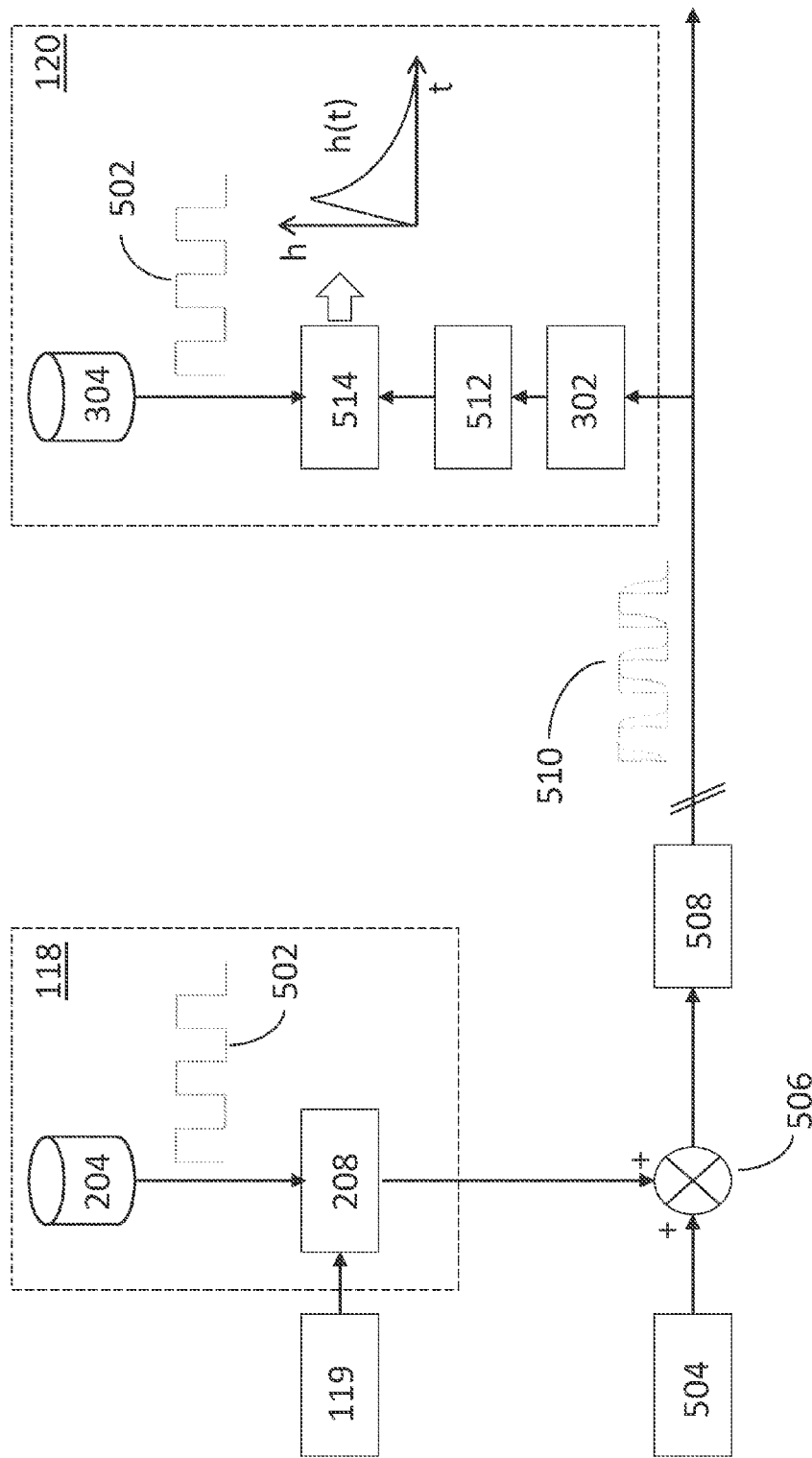
FIG. 5 is a schematic diagram illustrating an example method and apparatus for determining frequency response characteristics in an area of a grid.
Figure 6:
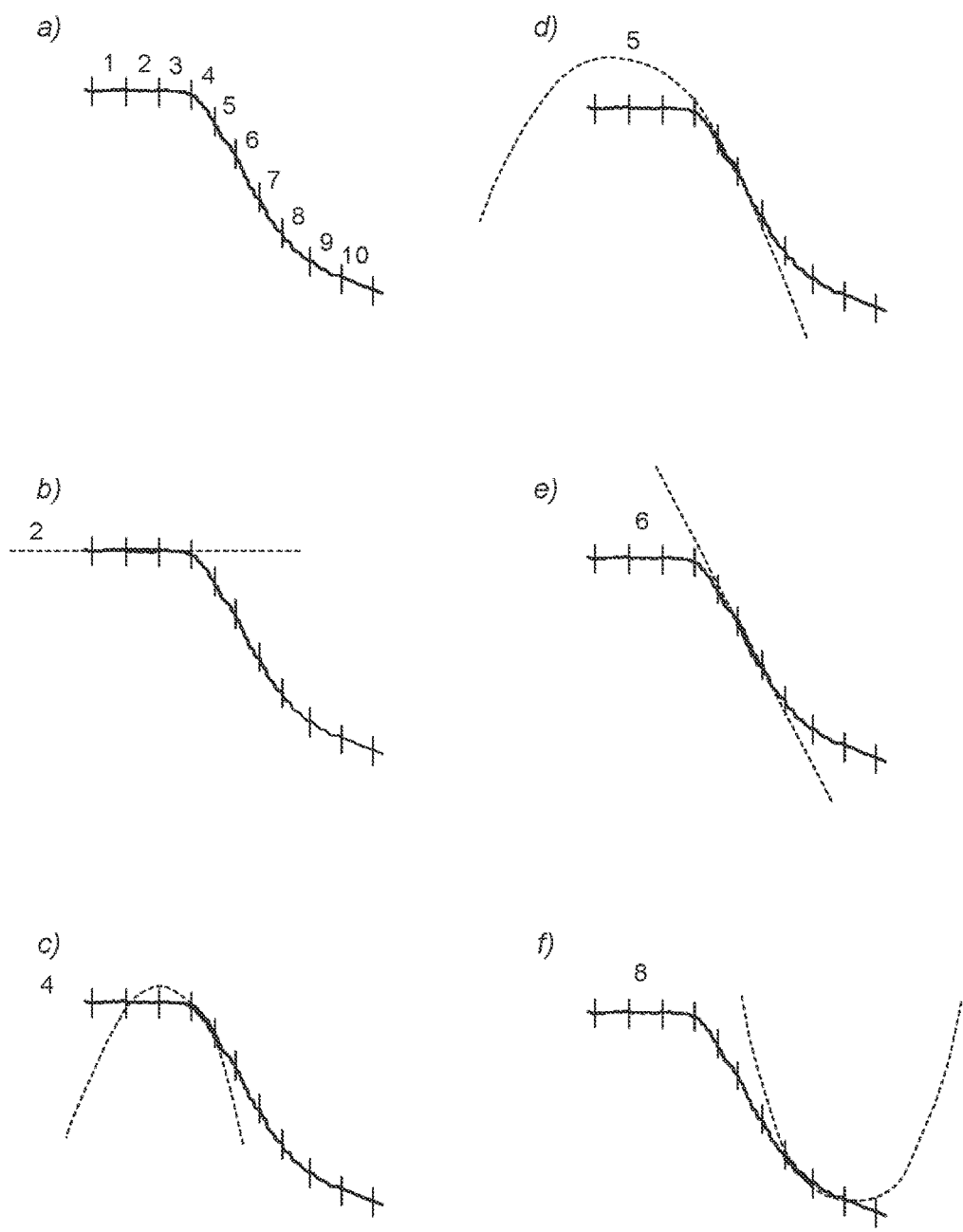
FIG. 6a is a diagram illustrating a series of intervals defined for a measured frequency characteristic.
FIG. 6b is a diagram illustrating a measured frequency characteristic can be fitted with a polynomial function.
FIG. 6c is a diagram illustrating a measured frequency characteristic can be fitted with a polynomial function.
FIG. 6d is a diagram illustrating a measured frequency characteristic can be fitted with a polynomial function.
FIG. 6e is a diagram illustrating a measured frequency characteristic can be fitted with a polynomial function.
FIG. 6f is a diagram illustrating a measured frequency characteristic can be fitted with a polynomial function.

An example method to determine frequency response characteristics, for example, inertia or stiffness, of given area of a grid at a given time is presented with reference to FIG. 5.

FIG. 5 shows a power unit 119 connected to part of a synchronous electric power grid 504 via a modulation device 118. The modulation device 118 may be the same as that shown in FIG. 2a, but in FIG. 5, only the data store 204 and modulator 208 components are shown for clarity. The data store 204 of the modulation device 118 has stored within it the code 502 assigned for use with the group of power unit(s) 119 and this code 502 is transmitted to the modulator 208 to produce a power modulated signal, which is added to the power flow of the rest of the grid at the point 506 at which the modulation device connects to the grid.

As described above, the power modulation gives rise to a corresponding frequency modulation. These modulation signals propagate through the measurement area of the grid 508. Notwithstanding the attenuation of the signals with distance, and any filtering, these signals propagate, in principle, over the entire synchronous grid.

The frequency response characteristics associated with the measurement area 508 give rise to a modification of the frequency modulated signal as illustrated by 510 and, for example, FIG. 4c.

The modified frequency modulated signal 510 is measured and processed by measurement device 120. The measurement device 120, which may be the same as that presented in FIG. 3, is shown in FIG. 5 to be comprised of a detector 302, an analogue to digital converter 512, a data store 304, and a correlator 514. (Note that the correlator 514 need not be a dedicated device and may be implemented as part of the processor 306 shown in FIG. 3, for example as software or firmware.)

The detector 302 detects the frequency modulated signal and feeds it into the correlator 514 via the analogue to digital converter.

As described above, the modulated signal includes an identifier identifying the power unit(s). The measurement device 120 accesses the data store 304 storing identifiers and determines a correspondence between the identifier included in the modulated signal 510 and one or more of the identifiers stored in the data store 304, thereby identifying the power units. On identification of the power unit(s) the measurement device 120 accesses the data store 304 to establish the associated power flow characteristics used to generate the detected frequency modulated signal 510.

The aforementioned power flow characteristics may include, for example, any of: the consumption and/or provision capacity of the unit(s), the magnitude of the power flow change for an individual unit, the total magnitude of power flow change for a group of units, the power modulation magnitude as a fraction of consumption and/or provision capacity of the unit(s), details of physical, electrical, unit class and/or geographic attributes, an indication of whether the unit(s) are providers or consumers of electrical power, the time duration of each power flow level used in modulation, the rise and/or fall time associated with switching between different levels of power consumption and/or provision during modulation, the precise form of the modulation used for power flow modulation of the unit(s), the reactive power contribution to the modulated power (e.g. the capability to vary the power factor).

The identifiers and the associated power flow characteristics stored in the data store 304 may be set and updated, for example, by control pattern, user interface, communications interface, factory setting or any other means. Alternative means of communicating the type, grouping and or power flow characteristics of the unit(s) to the measurement device 120 may also be, for example, by user interface, communications interface, or factory setting.

As a result of aforementioned identification of power unit(s) and establishment of power flow characteristics, the measurement device 120 constructs a copy of the transmitted power modulated signal.

The digitized detected frequency modulated signal and the copy of the transmitted power modulated signal are fed into the correlator 514.

The correlator 514 then correlates the two signals and fits parameters of a function h(t) that describes the effect of the measurement area of the grid 508 on the detected frequency modulated signal for the given power flow modulation, that is, h(t) describes the impulse response of the measurement area of the grid.

The fitted parameters which parameterize h(t) may include, for example, hmax, the maximum value of h(t), which characterizes the magnitude of grid frequency change for a given power balance change, and as such characterizes the stiffness of the measured area of the grid. The parameter hmax may be an absolute magnitude of grid stiffness, and, for example, be ascribed the units Hz W-1.

The fitted parameters of h(t) may also include, for example, tfall, a characteristic time constant of an exponential decay function fitted to h(t) at values of t occurring after hmax. This tfall characterizes the lag of the grid frequency change behind an impulse of power flow balance, and as such is characteristic of inertia of the measured area of the grid. This tfall may algebraically manipulated and normalized as necessary to provide an absolute magnitude of local grid inertia, for example with units of kg m2.

The fitting of the parameters of the impulse response function h(t) by the measurement device 120 in the illustrative example above therefore provides for the simultaneous determination of various frequency response characteristics, including for example inertia and stiffness, for a given area of a grid at a given time. It should be noted that the above illustrative example is a non-limiting example of an embodiment of an aspect of the current invention. For example, certain steps in the above example need not necessarily take place in the order presented, and may also occur simultaneously.

The electrical power referred to above can be real and/or reactive power. The modulation of real power flow may result from modulation using a purely resistive load such that the phase difference between (alternating) voltage and current remains close to zero. The magnitude of modulation in this case relates to a variation of real power flow. In the case of a variation in reactive power, the magnitude of modulation may relate to a magnitude of a reactive contribution, which can be varied by varying, for example, the phase difference between voltage and current, or the power factor. Alternatively, or in addition, modulation using a combination of real and reactive power modulation may be used.

A frequently updated grid stiffness characteristic may be useful, for example, for grid management, both since a significant change in the grid stiffness indicates that there has been a significant change in the capacity of the grid in absolute terms, relative terms and/or national or regional (e.g. distribution networks) terms, which may alert the grid operator to take steps towards identification and correction of the change, and also to enable efficient monitoring of the actual results of intended changes to grid stiffness the grid operator may wish to make.

Conventionally, actions to respond to changes in grid balance (to control the grid frequency to within agreed limits) are triggered by the grid frequency reaching a threshold value, as measured by e.g. locally distributed measurement devices. For example, in the UK the conventional trigger point for responding to a reduction in grid frequency is 49.8 Hz. As described below with reference to FIG. 7, the time taken to reach such a conventional trigger point, and therefore to begin responding to a change in grid frequency, is typically of the order of several seconds.

In accordance with an aspect of the invention, in order to reduce the time taken to respond to such changes in grid balance, in some embodiments, locally measured frequency characteristics may be analyzed to enable early identification of significant changes in the grid frequency. This analysis may be performed at the measurement device, for example, based on data collected from meters at local devices, as described below. The analysis may be performed by fitting a mathematical function, such as a polynomial extrapolation function and/or conic extrapolation function, to a series of values of the measured frequency characteristic (for example, measured at a series of times over a time interval). This may involve using a "sliding interval" approach to fit the function to a first series of values of the measured frequency characteristic covering a first interval. The interval is then moved to fit the function to a second series of values of measured frequency characteristic covering a second, later, time interval. The mathematical function has associated coefficients or parameters that define the form of the function. Therefore, for each time interval, the associated coefficients can be determined, and the coefficients for one time interval can be compared with the coefficients for another time interval to determine whether there is a change in the form of the fitted mathematical function. Such a method of identifying changes in the measured frequency characteristic is advantageous in that it typically enables changes to be detected earlier than they would otherwise be detected using a simple threshold value comparison.

Further, different weighting can be given for measured frequency characteristics in different time intervals, such that, for example, the largest weighting is given to measurements in the most recent time interval. This weighting procedure can act as a filter in that it can decrease the influence of spurious components of the measured frequency characteristic on the determination of the coefficients of the fitted function.

Fitting of the values of measured frequency characteristic also enables extrapolation of future values of the frequency characteristic which in turn enables forecasting of the amount of resources in the electric power grid 100 that will need to be utilized to react to a detected or predicted change.

Furthermore, by analyzing the coefficients of a fitted mathematical function, rather than making a comparison with a fixed threshold, it is possible to anticipate significant changes to the measured frequency characteristic in areas that have different local frequency response characteristics based on relatively small frequency level changes.

In a particular example, as shown in FIGS. 6a to 6f, which show variations of frequency with time t as measured locally, for example at a power unit 119, values of the measured frequency characteristic are fitted with a second order polynomial function. The functional form of the second order polynomial function is $at^2+bt+c$ and the parameters defining the form of the function are the coefficients a, b, and c. The polynomial function is fitted to the frequency characteristic measurements for each time interval successively, where "t=0" for the purposes of fitting is successively redefined to a consistent point within each successive time interval. In this exemplary implementation, changes in the grid frequency can be identified by determining changes in the values of a, b, and c.

FIG. 6a shows a measured frequency characteristic over a period of ten time intervals, labelled 1 to 10. It can be seen that over the course of the 10 time intervals there is a change in the frequency characteristic. In particular, the frequency characteristic is stable during time intervals 1, 2, and 3 and then begins to reduce in value in time interval 4. The rate of change of the frequency characteristic increases slightly to a maximum rate of change at interval 6 and then the rate of change decreases to interval 10.

FIGS. 6b to 6f show the fitting of a second order polynomial function to the measured frequency characteristic shown in FIG. 6a.

During time interval 2 (FIG. 6b), the frequency characteristic is stable such that the fitted polynomial function reduces to a linear function whose gradient close to zero.

During time interval 4 (FIG. 6c), the frequency characteristic begins to decrease. In this interval, the frequency characteristic measurements may be best fitted with a polynomial function which describes an inverted parabola, as indicated by the dashed curve. This inverted parabola maybe characterized, for example, by a negative value of coefficient "a". During time interval 5 (FIG. 6d), the rate of change (rate of decrease) of the frequency characteristic increases. Therefore, for example, the frequency characteristic measurements of interval 5 (FIG. 6d) may be best fitted with a polynomial describing a sharper inverted parabola with a steeper gradient over the interval. This steeper gradient might be characterized, for example, by an increase in the magnitude of coefficient "b".

During time interval 6 (FIG. 6e), the frequency characteristic reduces further, but in a substantially monotonic manner, and therefore may be best fitted with a linear function. Linear functions have coefficient a=0, which also marks a point of inflection in the notional functional form of the frequency characteristic.

During time interval 8 (FIG. 6f), the frequency characteristic is passed a point of inflection and the rate of change of the frequency characteristic is decreasing. Accordingly, the frequency characteristic measurements may be best fitted with a non-inverted parabola. This non-inverted parabola may be characterized, for example, by a positive value of coefficient "a". It can be seen from the above-described example that by comparing the coefficients of a polynomial function fitted to measured frequency characteristic values for one time interval with the coefficients for a subsequent time interval, for example, it is possible to detect significant changes in the form of the fitted function such as the onset of a decrease (or indeed increase) of the frequency characteristic (by detecting that the coefficients have a non-zero value), a change in the rate of change of the frequency characteristic (by detecting a change in the magnitude of the coefficients) and a turning point or point of inflection in the frequency characteristic (by detecting a change in sign of one or more of the coefficients).

Furthermore, by determining how the coefficients of the polynomial function change between time intervals it is possible to extrapolate the amount by which the frequency characteristic is likely to change. Typically, an accurate estimate of the total decrease (or increase) of the frequency characteristic can be made as the frequency characteristic approaches the turning point (FIG. 6e); this typically corresponds with a time following the onset of the decrease of the frequency characteristic of about 500 ms, which is a significantly shorter time frame than the time taken to reach a threshold value (for example, on the order of a few seconds).

The determined regional inertia characteristics may be used to determine parameters that may in turn be used to trigger some response to the change in grid frequency. For example, in response to a change in the grid frequency it may be desirable to send a signal, from the measurement device 120 to control a group of power units 119 to change their power consumption and/or provision behavior.

If there is a sudden drop in grid frequency (due to a sudden loss of generation capability or sudden increase in power consumption, for example), it may be desirable to send a signal to control power consuming power units 119 in the group to cease operating and/or to control power providing power units to start operating, to reduce a net power consumption in the electric power grid 100 and therefore restore the balance of power consumption and generation and consequently restore the grid frequency to its nominal level.

If however there is a sudden rise in grid frequency (due to a reconnection of a generation resource or a sudden reduction in power consumption, for example), it may be desirable to send a signal to control power consuming power units 119 in the group to begin operating and/or to control power providing power units to cease operating to increase a net power consumption in the electric power grid 100 and therefore restore the balance of power consumption and generation and consequently restore the grid frequency to its nominal level.

It should be noted that these power units 119 whose power consumption and/or provision changes as a response to a change in grid frequency need not be the same power units whose power consumption and/or provision is modulated as part of the frequency response characteristic measurement system. Indeed, it may be that power units whose power consumption and/or provision changes as a response to a change in grid frequency generally are selected to have more aggregated power available than those whose consumption and/or provision is to be modulated as part of the measurement system, in order that a change in their power consumption and/or provision behavior should have a more substantial impact on the restoration of grid frequency to its nominal level.

The measurement device may derive, based on measured frequency response characteristics associated with an area of the electric power grid 100, a triggering condition relating to a state of the grid frequency when restorative action should be taken. The triggering condition may be a level of the measured frequency characteristic itself or may, for example, be based one or more parameters, such as parameters relating to a fitting function applied to the measured frequency characteristic, or changes to those parameters, as described above with reference to FIG. 6.

Figure 7:
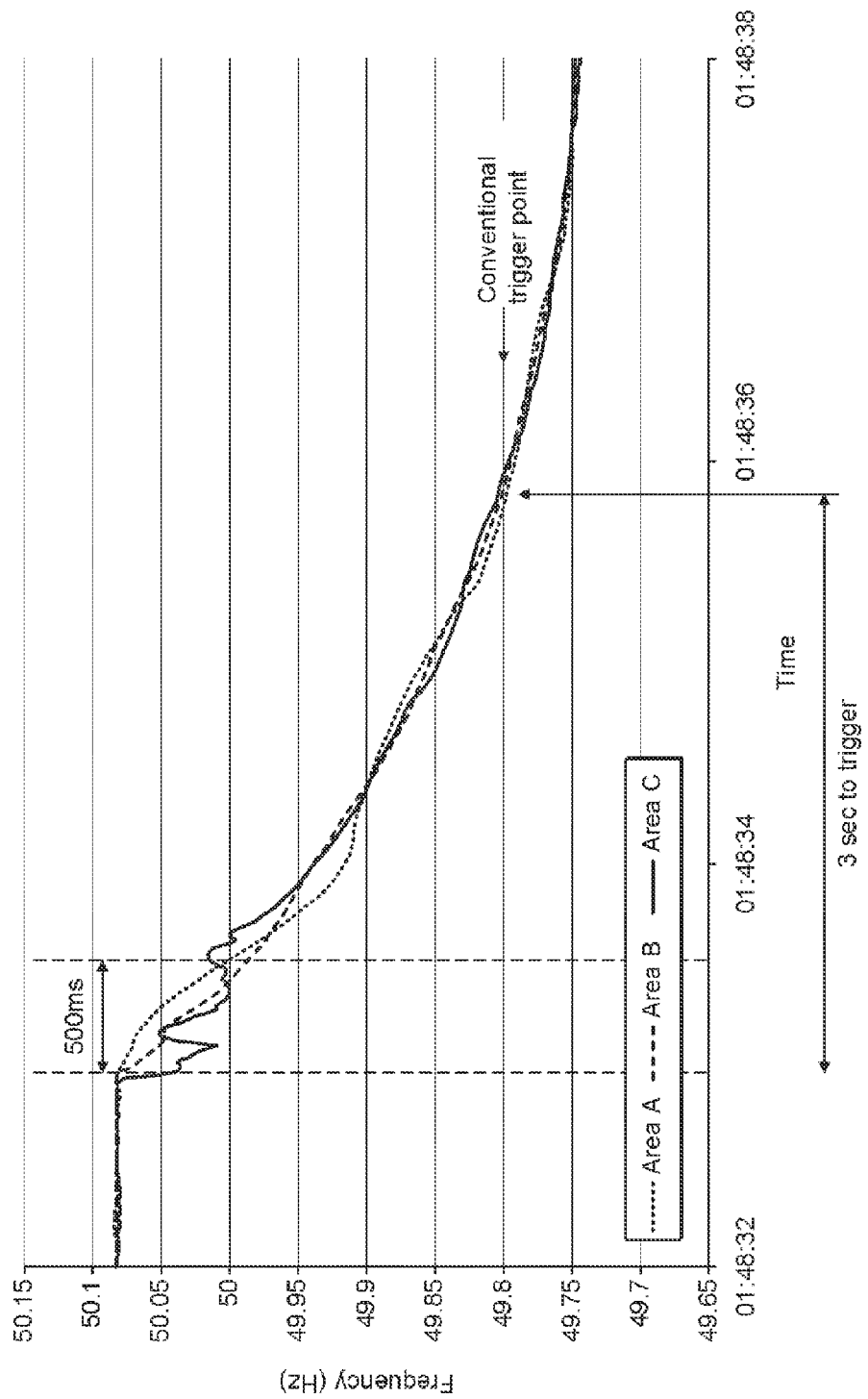
FIG. 7 is a graph showing a change in frequency in three exemplary regions in response to a sudden change in grid balance.

FIG. 7 is a plot showing an exemplary frequency response of an electric power grid 100 to a sudden shift in power balance. The particular data shown in FIG. 7 relates to a sudden disconnection at an interconnector neighboring electric power grids. The graph of FIG. 7 shows the frequency response detected in 3 regions of one of the grids; namely Area A, Area B and Area C. Each of these regions has a different mix of power generation, and therefore different amounts of grid inertia.

A hypothetical trigger point of 49.8 Hz, representing the frequency at which action is taken to respond to a frequency change in the grid, is shown in FIG. 7. It can be seen that following a sudden change in the grid balance, the time taken to reach the trigger point is of the order of several seconds. In the case of the particular event depicted the time taken to reach the conventional trigger point is 3 s.

In Area A, which has a relatively high inertia due to a relatively high proportion of spinning generation, the frequency responds to the same change in grid balance but at a much reduced rate of change.

In Area B there is a larger proportion of spinning generation than there is in Area A and therefore the response to the sudden change in grid balance, while immediate, is much smoother.

In Area C there is a relatively low proportion of so-called "spinning" generation; that is generation by conventional large-scale power stations that store relatively large quantities of mechanical energy in their associated turbines. Consequently, the response to the sudden change in grid balance is immediate and rapid.

It can therefore be seen that the nature of the initial frequency response of a synchronous electric power grid to sudden changes in grid balance varies regionally depending on the local grid inertia. Accordingly, the triggering conditions applied in different regions needs to be different in order to enable consistent triggering of a response. For example, in areas with relatively high inertia, a relatively small initial change in frequency may indicate a relatively large forthcoming change in frequency, whereas the same forthcoming change in frequency may be indicated by a relatively large change in frequency in an area with relatively low inertia. Accordingly, based on determined inertia values for different areas of the grid as described above, and/or other frequency response characteristics such as, for example, grid stiffness, the measurement device 120 may determine different conditions relating to the coefficients of the polynomial described above in relation to FIGS. 6a to 6f, on the basis of which a restorative change in power consumption and/or provision of the corresponding group of one or more power units is to be performed, as is described below. It should be noted that an inertia characteristic is an especially useful frequency response characteristic, since it enables prediction of the time dependence of a frequency characteristic response, and hence useful trigger conditions may also be derived solely on the basis of an inertia characteristic. It should be noted that a stiffness characteristic is also a useful frequency response characteristic for informing trigger conditions, since it can inform a prediction of the extent to which the measured frequency characteristic may change given a likely or common power balance change.

As a specific example with reference to FIG. 7 and the specific case of the response of the grid frequency in Area C, the trigger condition could, for example, be satisfied if the "a" coefficient of the fitted polynomial was still negative after the initial reduction in frequency of 0.08 Hz in 500 ms. The negative "a" coefficient indicates the reduction in frequency has not reached a point of inflection, and hence is likely to continue to reduce at a faster rate, which, when coupled with the high inertia of the grid in Area C, indicates a frequency change event significant enough to satisfy the trigger condition.

In some embodiments, a local measurement of a frequency characteristic may be made by a measurement instrument (such as a phasor) associated with one or more power units 119 in a group of power units 119; the group of power units referred to here may be the same group as those referred to above as generating the modulated frequency signal, or it may be a different group of power units 119. In this case, each measurement instrument may include a communications interface for communicating the measured frequency characteristic to the measurement device 120. The measurement device 120 may then determine whether a measured frequency characteristic, received from the measurement instrument, satisfies a determined triggering condition and, in response to determining that the triggering condition is satisfied, the measurement device 120 may send a request to one or more of the power units 119 in the group to change their consumption or provision of power.

Alternatively, the measurement device 120 may, transmit parameters for receipt at the power units 119 of the group, the parameters relating to a fitting function applied to the measured frequency characteristic and determined based on the determined frequency response characteristics. The parameters may then be received at the power units 119 of the group and used to derive a trigger condition. Whether the trigger condition is satisfied can be determined, at the power units 119 of the group, based on a frequency characteristic measured locally to the group. In response to a determination that the trigger condition is satisfied, power flow to and/or from each of the power units 119 in the group may be changed.

Figure 8:
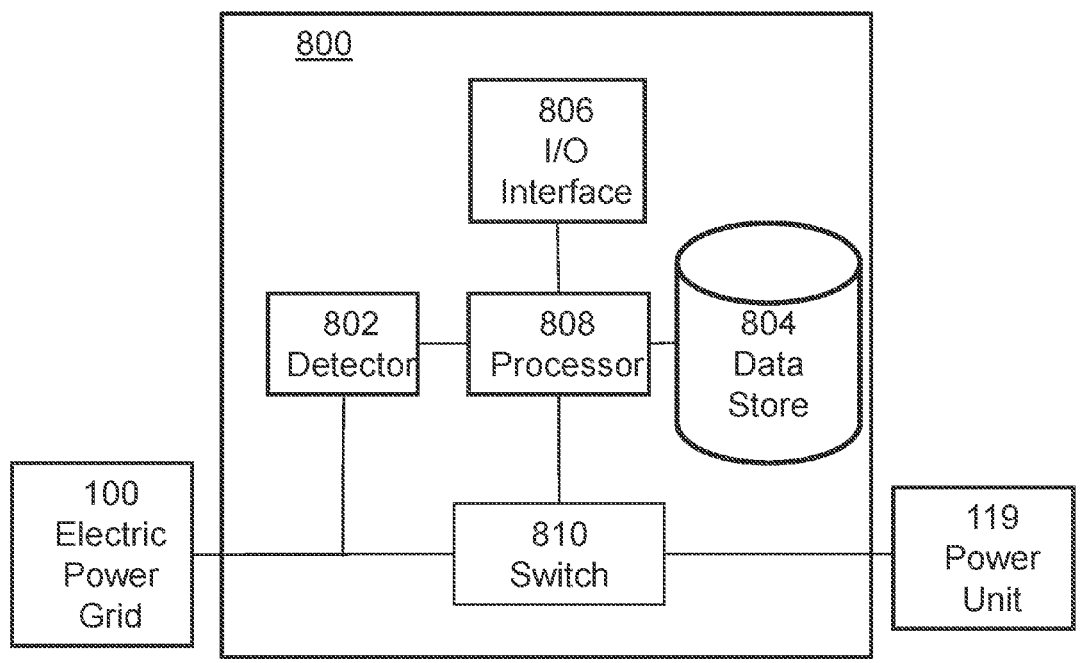
FIG. 8 is a schematic diagram illustrating a power control device.

To change the flow to and/or from the power unit 119, the power unit 119 may have an associated power control device. An exemplary arrangement of a power control device 800 is shown in FIG. 8. The power flow control device 800 cooperates with an associated power unit 119 in the same, or a similar way as the frequency modulation device 118 described above with reference to FIG. 2. As with the frequency modulation device 118, the power control device 800 may be external to the power unit 119 or may be integrated with the power unit 119. In some examples, the functions of the frequency modulation device 118 and the power control device may be performed by a single device.

The power control device 800 forms an interface between the electric power grid 100 and one or more power units 119 and operates with the one or more power units 119 to change power flow to and/or from the electric power grid 100. The power control device 800 comprises a detector 802, a data store 804, an input/output (I/O) interface 806, a processor 808, and a switch 810.

The detector 802 may be any device capable of detecting or measuring a characteristic relating to the grid frequency with sufficient precision.

In some embodiments, a time period relating to the grid frequency is used as a characteristic measure of the grid frequency. For example, a measurement of the half-cycle, which is the period between times at which the voltage crosses 0V, may be used as a characteristic relating to the grid frequency.

In some embodiments, the actual instantaneous grid frequency, corresponding to the inverse of the time it takes to complete a half-cycle (or a full-cycle) may be determined. The frequency data may be equalized and digitally filtered to remove frequency components outside a known and desired range of signal frequencies. For example, frequency components corresponding to the grid frequency and/or frequency components relating to noise may be removed.

In one embodiment, the detector 802 may comprise a voltage detector arranged to sample the voltage at a frequency higher than the grid frequency and an analogue to digital converter arranged to convert the sampled voltage to a digital voltage signal. For example, the voltage detector may be arranged to sample the voltage 1000 times per cycle. The digital voltage signal may then be processed to determine with a high degree of precision (within the range µs to ms) the times at which the voltage crosses 0V.

In another embodiment, the detector 802 may comprise a current detector arranged to sample the current at a frequency higher than the grid frequency, and an analogue to digital converter arranged to convert the sampled current to a digital current signal, which may then be processed to determine with a high degree of precision (within the range µs to ms) the times at which the current crosses 0V.

In still another embodiment, the detector 802 may comprise both a voltage detector and a current detector. Measuring the times at which both the voltage and current crosses 0V enables the detector 802 to determine a change in the relative phase of the voltage and current, thereby enabling the detector 802 to compensate for changes in reactive power in the grid. This in turn enables a more accurate measurement of frequency (or a characteristic relating to frequency).

In addition to, or as an alternative to, measuring the grid frequency, the detector 802 may measure a rate of change of frequency of power flowing in the grid based on measurements of voltage and/or current, as described above.

The detector 802 may include phasor measurement instrumentation arranged to measure said frequency characteristic on the basis of a phasor measurement, in which a phase associated with a vector of voltage measured in the electric power grid is measured with reference to an absolute time reference.

The I/O interface 806 of the power control device 800 enables communication between the power control device and the measurement device 120. The power control device 800 intermittently receives one or more parameters derived, as described above, from frequency response characteristics of the electric power grid 100. In particular, the power control device 800 receives parameters that are derived based on frequency response characteristics specific to the area or location in which it is located so that the power control device 800 can derive, on the basis of a received parameter, a trigger condition that it specific to the location or area in which it is operating. The trigger condition may be the received one or more parameters themselves or may be some other condition derived from the received one or more parameters.

Data relating to the trigger condition and/or the received parameters may be stored in the data store 804. Similarly, measured frequency characteristic of electric power flowing in the electric power grid 100 may be stored in the data store 804.

The data store 804 may also store identification data relating to the power control device 800, the power unit or units 119 with which the power control device is associated, or groups to which the power unit 119 or units 119 belong. It should be noted that, although the identification data is described above as being stored in the data store 804 of the power control device 800, in some embodiments, the codes may be transmitted to the power control device 800, for example from the measurement device, in which case they may not be stored at the power control device 800, or stored only in a temporary data store. The identifier stored in the power control device 800 may be prescribed at the point of manufacture or installation of the power control device 800, or it may be communicated to the power control device 800 via the I/O interface 806.

The processor 808 accesses the data store 804, to access the data relating to trigger condition and, based on a measured frequency characteristic (which may also be accessed from the data store 804), determines whether the trigger condition is satisfied.

In response to a determination that the trigger condition is satisfied, the processor 808 sends a control signal to the switch 810 for controlling the flow of power to the power unit 119.

The switch 810 may be a simple relay device which turns power supply on- and off in response to a control signal from the processor 808. Alternatively or additionally, the switch 810 may comprise an attenuator or a phase inverter, etc. used to attenuate real or reactive power flowing to or from the power unit 119. The action of the switch 810 thus provides a change to the power flowing to or from the power unit 119 which has a corresponding effect on the grid balance and accordingly has a corresponding effect on the grid frequency. The amplitude of the effect depends on the power consumption of the power unit 119. In order to coordinate the power control devices such that a combined change in the net grid balance is sufficient to maintain the grid frequency within (or restore the grid frequency to within) agreed limits, groups of one or more power control devices may each respond to a determination that the trigger condition is satisfied and therefore each change the power flow to or from their respective power unit 119 or power units 119.

There may be different rules stored in the data store defining the extent, duration and scheduling of attenuation of the power flow to the unit 119 following a determination that the trigger condition is satisfied. These rules may include conditions on a measured frequency characteristic, for example that the attenuation of power flow is maintained for as long as the frequency characteristic is outside a predefined range centered on the nominal grid frequency.

The duration and extent of attenuation may also be based, for example, on characteristics indicating the severity of the frequency characteristic change. There may be rules defining scheduling, for example, relating to times when an attenuation is permitted to take place. These rules may be stored in the data store 804 for the processor 808 to access when the trigger condition is satisfied, or at other times. These rules held in the data store 804 may be updated from time to time via the I/O interface 806 and communications network. Additionally, or alternatively, these rules may be prescribed at the point of manufacture or installation of the device.

Although the power control device 800 is shown in FIG. 8 as a separate device to the power unit 119, in some cases the power control device may be integrated in the power unit 119. Further, the switch 810 is not necessarily located exterior to the power unit 119, but may instead be installed in the unit, and be arranged to control power supply from the interior of the device; this latter case is advantageous where the power unit 119 may move from location to location, as is the case, for example if the power unit is a Personal Electric Vehicle or other device.

The power control device 800 may also be arranged to process measured data. For example, the processor may execute a computer program stored in the data store 804 that it configured to fit the measured frequency characteristics, as described above with reference to FIGS. 6*a* to 6*f*.

The measurement device 120 described above with reference to FIG. 3, may be employed in combination with a distributed plurality of power control devices 800 to form a system for responding to changes in the grid frequency. In such a system, the measurement device 120 determines a frequency response characteristic associated with each area of the electric power grid 100, determines a trigger condition for each area and transmits area specific trigger condition to each of the power control devices.

The power control devices 800 may each measure a local frequency characteristic and transmit data indicative of a polynomial function representative of the local frequency characteristic to the measurement device 120. The measurement device 120 may then extrapolate, based on the polynomial function, future expected values associated with the frequency characteristic to determine, for example, an expected power flow requirement for responding to an expected change in grid frequency.

It will be understood that in some implementations, the measurement device 120 may receive the frequency characteristic itself and determine a polynomial function fitting the measured frequency characteristic. Furthermore, it will be understood that in some implementations the power control devices 119 may perform the extrapolation of the future expected values and/or the determination of the expected power flow requirement, and may transmit this information to the measurement device 120.

The measurement device 120 may access a database storing profile information relating to power consumption and/or provision characteristics of power units 119 connected to the electric power grid 100. The measurement device 120 may use the profile information to define one or more groups of power units 119 based on the profile information and the expected power flow requirement, such that the groups of power unit 119 have a net power consumption and/or provision capacity capable of satisfying the power flow requirement and transmit signals to the defined one or more groups accordingly.

The measurement device 120 may, for example, transmit requests or commands to the power control devices 800 of the defined groups to control consumption and/or provision of electrical power by the power units 119 associated with the power control devices 800. In this way the system can increase or decrease a net consumption of electrical energy in each of the areas of the electric power grid 100 in response to changes of frequency in those areas.

In a further example embodiment, a system for providing a dynamic response to a change in grid frequency is provided. The system comprises a measurement device, such as the measurement device 120 described above, arranged to access the a database, such as the power unit data store 304 described above, comprising, for example, profile information relating to the consumption and/or provision of power by the power units 119 and/or their location or grid location.

The measurement device 120 is then arranged to define, on the basis of the profile information, one or more groups of power units 119 associated with power control devices 118. For example, there could be three groups defined for a given grid area, each with a similar number of power units of a similar class. The system is then arranged to assign different trigger conditions to each of the different groups and transmit the assigned trigger conditions to the groups.

The trigger conditions could be derived from measurements of frequency response characteristics such as, for example, related to local grid inertia and stiffness, as described above.

The trigger conditions may be set such that one or more groups may have their trigger conditions satisfied simultaneously, or near simultaneously, in order to provide a response commensurate to a given frequency characteristic change event. In an example, the trigger conditions for the three groups of power units could be set to correspond to a low, medium, and high trigger sensitivity. For only a minor frequency characteristic change event therefore, only the group with high sensitivity trigger condition may have a satisfied trigger condition and therefore undergo a change in power flow to/from the associated unit. For a medium severity frequency characteristic change event, both the group with the high sensitivity trigger condition, and the group with the medium sensitivity trigger condition may have a satisfied trigger condition and therefore change the power flow to/from their associated power units. For a severe frequency characteristic frequency change event, all three groups, including the group with the low sensitivity trigger condition, may have a satisfied trigger condition and therefore change the power flow to/from their associated power units. The satisfaction of the trigger conditions of the different groups may be simultaneous, near simultaneous, or offset in time from one another.

Alternatively, the triggering conditions of the different groups may be set such that during a frequency characteristic change event, groups may be sequentially triggered to provide a commensurate response to the frequency characteristic change event. For example, the triggering conditions may be set such that if a frequency characteristic change event is not sufficiently corrected by an initial response provided by the triggering of a first group, a further group may be triggered to enable an enhanced response towards correction. Further groups may be further triggered up until a predefined limit of response, or until the frequency characteristic has been corrected to its nominal value, for example.

The groups of power units need not necessarily be of similar number or class. The power class of each group may be defined, for example, to achieve a desired dynamic response. For example, a group defined including units of a high power flow class may be assigned a trigger condition satisfied by a high severity event. Also, for example, the number of power units in each group could be changed, or the number of groups may be changed to provide for different forms of dynamic response.

In such a way, groups of power units in a given area connected to power control devices may provide a designed dynamic correction response to a frequency change event, and after an initial communication of assigned trigger conditions, may do so autonomously. This is advantageous since it provides for a corrective response to a frequency change event that is commensurate to the event, and hence avoids changing power flow to/from units unnecessarily.

The above embodiments are to be understood as illustrative examples of the invention. Further embodiments of the invention are envisaged. For example, although in the above description, trigger conditions are derived or defined in the measurement device 120, it will be understood that in some implementations the power control device itself may be capable of measuring or determining a local frequency response characteristics and may, on the basis of those measured characteristics, derive appropriate trigger conditions. The power control device 800 may measure a frequency characteristic and determine whether the frequency characteristic satisfies the trigger condition and, in the event that it does, the power control device 800 may change the real and/or reactive power flowing to and/or from its associated power unit or units 119 without reference to the measurement device 120.

In a further embodiment, an autonomous power control device 800, which "learns" an appropriate trigger condition for the grid area in which it is placed, is arranged to measure, at detector 802, a frequency characteristic of electric power flowing in the electric power grid 100, determine whether the measured frequency characteristic has satisfied a triggering condition, and in response to a determination that the trigger condition is satisfied, change, using switch 810, a power flow to and/or from the one or more associated power units 119 for a certain amount of time.

The amount of time for which the power flow should be changed, as discussed above in other embodiments, can be, for example, factory set, set by a user interface, or dependent on the grid frequency returning to within a predefined limit of its nominal value.

In order to determine whether the trigger condition has been satisfied, any of the methods described in the above embodiments may be used, such as, for example, monitoring of parameters of polynomial functions fit to successive measurements of frequency characteristic.

More simply, a trigger condition may set to be satisfied if the measured frequency response characteristic is measured to have changed to a certain extent in a certain amount of time.

The triggering condition in an initial "out of the box" instance may, for example, be factory set or set by user interface. There may also be no set trigger condition in the first instance.

The autonomous power control device 118 is arranged to analyses the measured frequency characteristic measured at times around the point of satisfaction of a threshold condition of measured frequency characteristic. This threshold condition may be set such that it is satisfied when the measured frequency characteristic is outside a range set about a nominal value. The analysis times may be set to, for example, a few seconds either side of the time when the threshold condition is satisfied. The analysis may include, for example, fitting of polynomial or exponential functions to the measured frequency characteristic for the set time window around the satisfaction of the threshold condition. Other analysis could determine, for example, characteristics relating to the total extent of measured frequency characteristic change, the total time for the measured frequency characteristic to change between two substantially stable values, and/or the average rate of change of the measured frequency characteristic between the two substantially stable values.

In any case, the autonomous power control device 800 is arranged to derive one or more parameters from said analysis characterizing the change in frequency characteristic around the point of satisfaction of the threshold condition.

The autonomous power control device 800 is arranged to then derive a trigger condition based on the parameters derived from said analysis. It may be, for example, that the analysis determined that the measured frequency characteristic changed a relatively large amount in a relatively short amount of time. (This may be the case in an area of the grid characterized by a relatively low inertia and a relatively low stiffness, for example.) The trigger condition may therefore, for example, be set to be satisfied by changes in measured frequency characteristic corresponding to a relatively small change over a given time duration.

The autonomous power control device 800 is arranged to update any existing trigger condition used previously in the power control device 800, with the trigger condition derived from the analysis. If no trigger condition was set previously in the device, the derived trigger condition may define an initial trigger condition. The updated trigger condition may be partly based on previously determined trigger conditions, and/or on statistics associated with these previously determined trigger conditions. This may help to reduce the effect of spurious determinations of trigger conditions. For example, a new trigger condition may be formed of an average of all trigger conditions determined by the device. This average, for example, may include only a set of the latest determined trigger conditions, for example, the last ten, so that the trigger condition may also easily adapt to changes in the grid nature of the area of the grid to which it is local.

The learning algorithms described above should be taken as examples only. Relatively simple algorithms such as those described above may be advantageous in that they require relatively little computing resources. However, other, for example, more complex, algorithms are envisaged. Specifically state of the art Self-Organizing Maps (e.g. Kohonen SOM) and other neural network and/or artificial intelligence algorithms may be used.

The autonomous power control device 800 is arranged to repeat the above analyzing, deriving and updating for every successive change in measured frequency characteristic that results in the threshold condition being satisfied. The autonomous power control device 800 therefore "learns", by its own analysis of the nature of the frequency characteristic change events, the trigger condition that is most appropriate and effective for the area of the grid in which it is deployed.

The threshold condition used in each learning repetition may be linked to the trigger condition, for example if an updated trigger condition is more sensitive than the preceding trigger condition, then the threshold condition may also be updated to correspond to a narrower range of frequency characteristic about the nominal value.

The autonomous power control device 800 may be arranged to analyses the measured frequency characteristic at times about a satisfaction of the threshold condition a certain number times without defining a trigger condition. This would allow the device to learn parameters for use in derivation of a trigger condition appropriate for the area in which the device is located before implementing the trigger condition in the device. This may avoid erroneous trigger condition satisfaction in the early stages of the deployment of the autonomous power control device in a given grid area.

The above described embodiment of a power control device 800 is advantageous since it is an autonomous, standalone device which requires no communication means, and therefore may be relatively cost effective in its operation and easy to implement.

In various embodiments detailed in the above description, reference is made to a measurement system in the form of a single measurement device 120. It should be noted, however, that in some embodiments, a distributed measurement system may be used. This distributed measurement system may comprise, for example, a combination of the components of the measurement device referred to in FIG. 3, namely a data store 304, a clock 310, an I/O interface 308, a processor 306, and a detector 302 arranged in a distributed way. The measurement system may also include one or more centralized control units. These centralized control units may be used, for example, for centralized processing of measurements taken by the measurement devices, or any other device described herein, and/or, for example, for performing the receiving and transmitting of characteristics, parameters, and/or conditions described herein from and/or to any of the devices described herein. The centralized control unit may also perform functions of data storage otherwise implemented in the various devices described herein. The measurement system may also take the form of a non-distributed device similar to the exemplary embodiment described with reference to FIG. 3.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

What is claimed is:

1. A method of determining, in a measurement system, a frequency response characteristic within a synchronous area of an electric power grid, electricity flowing in the grid in accordance with a grid frequency, wherein the electric power grid is connected to a first group of one or more power units each arranged to consume electric power from and/or provide electric power to the electric power grid such that a change in power provision and/or consumption by said first group of one or more power units results in a change in power flow in the electric power grid, wherein power flow to and/or from each of the power units is modulated on the basis of a sequence of control signals, thereby modulating the grid frequency to provide a frequency modulated signal according to the sequence of control signals, the method comprising:

measuring, in the measurement system, a frequency characteristic relating to a frequency of electricity flowing in the electric power grid;

accessing a database storing data relating to power characteristics of said one or more power units and determining, on the basis thereof, a characteristic relating to said power flow modulation; and determining a frequency response characteristic associated with at least one area of said electric power grid on the basis of the measured frequency characteristic and the determined power flow modulation characteristic, wherein the frequency response characteristic relates to an inertia characteristic and/or a stiffness characteristic of the electric power grid.

2. The method of claim 1, wherein determining the frequency response characteristic comprises correlating the measured frequency characteristic with said power flow modulation characteristic.

3. The method of claim 1, wherein determining the frequency response characteristic comprises determining a ratio of said power flow modulation characteristic and the measured frequency characteristic.

4. The method of claim 1, wherein said power flow modulation characteristic comprises a magnitude characteristic relating to said power flow modulation.

5. The method of claim 4, wherein said magnitude characteristic comprises an amplitude of the power flow.

6. The method of claim 1, wherein said measured frequency characteristic is measured on the basis of one or more of: a frequency of alternating voltage, a frequency of alternating current, a measured frequency of power flowing in the electric power grid; a rate of change of frequency; a period of alternating current or voltage.

7. The method of claim 1, wherein said measured frequency characteristic comprises a time variation in frequency associated with said modulated signal.

8. The method of claim 1, wherein said frequency response characteristic comprises an inertia characteristic.

9. The method of claim 8, wherein said inertia characteristic comprises at least one of a rise time and a fall time associated with said frequency modulated signal.

10. The method of claim 1, wherein said frequency response characteristic comprises a characteristic relating to a magnitude of variation in grid frequency per unit change in power balance.

11. The method of claim 1, wherein of the first group of power units is a distributed group of power units, the method comprising:

modulating power flow to and/or from each of the first group of power units in accordance with a control pattern, such that the consumption and/or provision of power by the plurality of power units is coordinated to provide a collective frequency modulated signal, having a collective frequency characteristic, that is detectable by the measurement system.

12. The method of claim 11, comprising sending a signal specifying said control pattern to each power unit of the first group of power units.

13. The method of claim 11, wherein the control pattern comprises a repeating pattern, and the method comprises controlling power to and/or from the first group of one or more power units continuously according to the repeating pattern.

14. The method of claim 11, comprising controlling power to and/or from the first group of one or more power units intermittently according to the control pattern.

15. The method of claim 11, wherein said collective modulated signal includes an identifier identifying said group of power units, the method comprising:

accessing a database storing one or more identifiers each associated with said first group of one or more power units; and determining a correspondence between the identifier included in the collective modulated signal and one or more of the identifiers stored in the database, thereby identifying said first group of one or more power units.

16. The method of claim 15, wherein each identifier stored in the database is associated with at least one area of the electric power grid and the method comprises determining an area with which the determined frequency response characteristic is associated on the basis of the determined identifier correspondence.

17. The method of claim 1, the method comprising:
determining, on the basis of the determined frequency response characteristic, one or more parameters for use in triggering a change in consumption and/or provision of power by the first group of one or more power units or by a second group of one or more power units, the second group of one or more power units being connected to the electrical power grid and arranged to consume power from and/or provide power to the electric power grid; and
transmitting said one or more parameters for receipt at the first group of one or more power units or said second group of power units.

18. The method of claim 17, comprising:
receiving, at the first group of power units or the second group of power units, said one or more parameters;
deriving, on the basis of the received parameters, a trigger condition;
determining, based on a measured frequency characteristic of electric power flowing in the grid locally to the first group of power units or the second group of power units, whether the trigger condition is satisfied; and
in response to a determination that the trigger condition is satisfied, changing a power flow to and/or from the first group of power units or the second group of power units.

19. The method of claim 17, comprising:
defining, at the measurement system, a first series of values associated with the frequency characteristic during a first time period and a second series of values associated with the frequency characteristic during a second, later, time period;
determining, at the measurement system, a first polynomial function having a first set of coefficients on the basis of said first series of values and a second polynomial function having a second set of coefficients on the basis of said second series of values; and
determining, at the measurement system, whether the trigger condition is satisfied on the basis of a difference between the first set of coefficients and the second set of coefficients.

20. The method of claim 1, wherein the electric power grid is connected to a second group of one or more power units arranged to consume power from and/or provide power to the electric power grid, the method comprising:
determining, based on the determined frequency response characteristic associated with an area associated with the second group of power units, one or more parameters for use in triggering a change in consumption and/or provision of power by the second group of one or more power units;
deriving a trigger condition on the basis of the measured frequency response characteristic;
measuring, in the area associated with the second group of power units, a frequency characteristic relating to a frequency of electricity flowing in the electric power grid;
communicating the measured frequency characteristic measured in the area associated with the second group of power units to the measurement system;
determining, based on the communicated measured frequency characteristic, whether the trigger condition is satisfied; and
in response to a determination that the trigger condition is satisfied, sending a request to the second group of power units to change a power flow to and/or from the second group of power units.

21. The method of claim 1, wherein the power modulation comprises modulation of at least one of real power and reactive power.

22. A measurement system for determining a frequency response characteristic within a synchronous area of an electric power grid, wherein electricity flows in the grid in accordance with a grid frequency and the electric power grid is connected to a group of one or more power units each arranged to consume electric power from and/or provide electric power to the electric power grid such that a change in power provision and/or consumption by said power unit results in a change in power flow in the grid, wherein power flow to and/or from each of the power units is modulated on the basis of a sequence of control signals, thereby modulating the grid frequency to provide a frequency modulated signal, the measurement system being arranged to:
measure a frequency characteristic relating to a frequency of electricity flowing in the electric power grid;
access a database storing data relating to power characteristics of said one or more power units and determine, on the basis thereof, a characteristic relating to said power flow modulation; and
determine a frequency response characteristic associated with at least one area of said electric power grid on the basis of the measured frequency characteristic and the determined power flow modulation characteristic, wherein the frequency response characteristic relates to an inertia characteristic and/or a stiffness characteristic of the electric power grid.

23. A power control device for use with one or more associated power units to provide a response to changes in a frequency of electricity flowing in a synchronous area of an electric power grid, wherein the electric power grid is connected to a measurement system arranged to determine a frequency response characteristic of the grid in said area and to determine one or more trigger parameters on the basis of the measured frequency response characteristic, the power control device being arranged to:
intermittently receive one or more parameters from the measurement system, the parameters being derived from a said determined frequency response characteristic, the frequency response characteristic relating to an inertia characteristic and/or a stiffness characteristic of the electric power grid;
derive, on the basis of the received one or more parameters, a trigger condition;
determine, based on a measured frequency characteristic of electric power flowing in the grid, whether the trigger condition is satisfied; and
in response to a determination that that the trigger condition is satisfied, change a power flow to and/or from the power unit.

24. The power control device of claim 23, wherein one of the received one or more parameters comprise said trigger condition.

25. The power control device of claim 23, wherein said frequency response characteristic comprises the inertia characteristic.

26. The power control device of claim 23, wherein said frequency response characteristic comprises a characteristic relating to a magnitude of variation in grid frequency per unit change in power balance.

27. The power control device of claim 23, arranged to:
define a first series of values associated with the frequency characteristic during a first time period and a second series of values associated with the frequency characteristic during a second, later, time period;
determine a first polynomial function having a first set of coefficients on the basis of said first series of values and a second polynomial function having a second set of coefficients on the basis of said second series of values; and
determine whether the trigger condition is satisfied on the basis of a difference between the first set of coefficients and the second set of coefficients.

28. The power control device of claim 27, wherein the first and second polynomial functions are second order polynomial functions.

29. The power control device of claim 27, wherein a frequency change event is identified on the basis of a value of at least one coefficient of the second set of coefficients differing from a corresponding coefficient in the first set of coefficients by more than a predetermined amount.

30. The power control device of claim 27, arranged to measure said series of values according to a polynomial extrapolation technique and/or conic extrapolation technique.

31. The power control device of claim 23, comprising phasor measurement instrumentation arranged to measure said measured frequency characteristic on the basis of a phasor measurement.

32. The power control device of claim 31, wherein the phasor measurement instrumentation is arranged to measure a phase associated with a vector of voltage measured in the electric power grid with reference to an absolute time reference.

33. The power control device of claim 23, wherein the measured frequency characteristic includes one or more of: a frequency of alternating voltage, a frequency of alternating current, a frequency of power flowing in the electric power grid; a rate of change of frequency; and a period of alternating current.

34. The power control device of claim 23, arranged to receive a signal, said signal indicating a time period during which power flow may be controlled.

35. The power control device of claim 23, wherein the change in the power flow to and/or from the power unit comprises modulation of at least one of real power and reactive power.

36. A system for responding to changes of frequency in an electric power grid, the system comprising:
a distributed plurality of power control devices for use with one or more associated power units to provide a response to changes in a frequency of electricity flowing in a synchronous area of the electric power grid, wherein the electric power grid is connected to a measurement system arranged to determine a frequency response characteristic of the grid in said area and to determine one or more trigger parameters on the basis of the determined frequency response characteristic, each power control device being arranged to:
intermittently receive one or more parameters from the measurement system, the parameters being derived from a said determined frequency response characteristic, the frequency response characteristic relating to an inertia characteristic and/or a stiffness characteristic of the electric power grid;
derive, on the basis of the received one or more parameters, a trigger condition;
determine, based on a measured frequency characteristic of electric power flowing in the grid, whether the trigger condition is satisfied; and
in response to a determination that that the trigger condition is satisfied, change a power flow to and/or from the power unit,
wherein each power control device controls a respective power unit connected to the electric power grid; and
a measurement system for transmitting one or more trigger parameters to each of the plurality of distributed power control devices.

37. The system of claim 36, wherein the measurement system is arranged to:
define, a plurality of groups of power control devices from said distributed plurality of power control devices;
assign different respective trigger conditions to each of the plurality of groups; and
transmit, to each of the power control devices a trigger condition assigned to the group to which it is assigned.

38. The system of claim 37, wherein the measurement system is arranged to:
access a power unit database storing profile information relating to the consumption and/or provision of power by the power units associated with the power control devices; and
define said plurality of groups on the basis of the accessed profile information.

39. The system of claim 36, wherein the measurement system is arranged to:
receive data indicative of a polynomial function representative of the measured frequency characteristic;
extrapolate, based on said polynomial function, future expected values associated with the measured frequency characteristic; and
determine, on the basis of the extrapolated future expected values, an expected power flow requirement for responding to a frequency change event.

40. The system of claim 39, wherein the measurement system is arranged to:
access a power unit database comprising profile information relating to the consumption and/or provision of power by the power units;
define, on the basis of the expected power flow requirement and said profile information, one or more groups of one of more power units for responding to the frequency change event.

41. The system of claim 40, wherein the measurement system is arranged to transmit one or more requests, for receipt at the power control devices of the defined groups, to control consumption and/or provision of electrical power by the power units associated with power control devices, thereby varying a net consumption of electrical energy in said area.

* * * * *